(12) United States Patent
Yeo et al.

(10) Patent No.: US 11,563,526 B2
(45) Date of Patent: Jan. 24, 2023

(54) APPARATUS AND METHOD FOR PERFORMING RETRANSMISSION IN WIRELESS COMMUNICATION SYSTEM

(71) Applicant: Samsung Electronics Co., Ltd., Gyeonggi-do (KR)

(72) Inventors: Jeongho Yeo, Gyeonggi-do (KR); Younsun Kim, Gyeonggi-do (KR); Sungjin Park, Gyeonggi-do (KR); Jinyoung Oh, Gyeonggi-do (KR); Taehan Bae, Gyeonggi-do (KR); Juho Lee, Gyeonggi-do (KR)

(73) Assignee: Samsung Electronics Co., Ltd

( * ) Notice: Subject to any disclaimer, the term of this patent is extended or adjusted under 35 U.S.C. 154(b) by 61 days.

(21) Appl. No.: 17/055,348

(22) PCT Filed: May 15, 2019

(86) PCT No.: PCT/KR2019/005811
§ 371 (c)(1),
(2) Date: Nov. 13, 2020

(87) PCT Pub. No.: WO2019/221499
PCT Pub. Date: Nov. 21, 2019

(65) Prior Publication Data
US 2021/0226732 A1 Jul. 22, 2021

(30) Foreign Application Priority Data
May 15, 2018 (KR) .................. 10-2018-0055527

(51) Int. Cl.
*H04L 1/18* (2006.01)
*H04L 1/08* (2006.01)

(52) U.S. Cl.
CPC . *H04L 1/18* (2013.01); *H04L 1/08* (2013.01)

(58) Field of Classification Search
CPC .... H04L 1/18; H04L 1/00; H04L 1/08; H03M 13/2906; H03M 13/2909; H03M 13/6306;
(Continued)

(56) References Cited

U.S. PATENT DOCUMENTS 10,355,819 B2   7/2019 Yeo et al.
11,146,363 B2 * 10/2021 Cao ...................... H04L 1/0057
(Continued)

FOREIGN PATENT DOCUMENTS

CN    107733565    2/2018
EP     3282615    2/2018
(Continued)

OTHER PUBLICATIONS

Qualcomm Incorporated, "Multi-bit HARQ-ACK Feedback", R1-1702636, 3GPP TSG-RAN WG1 #88, Feb. 13-17, 2017, 9 pages.
(Continued)

*Primary Examiner* — Edan Orgad
*Assistant Examiner* — Vanneilian Lalchinthang
(74) *Attorney, Agent, or Firm* — The Farrell Law Firm, P.C.

(57) ABSTRACT

Disclosed is a 5$^{th}$ generation (5G) or a pre-5G communication system for supporting a data transmission rate higher than that of a 4$^{th}$ generation (4G) communication system such as long term evolution (LTE). An apparatus and a method for performing retransmission in a wireless communication system are provided. A method for operating a transmitting device in a wireless communication system, according to various embodiments of the present disclosure, comprises the steps of: transmitting a plurality of data code blocks (CBs) to at least one receiving device in an initial transmission step; receiving, from the at least one receiving device, feedback information including information for indi-
(Continued)

cating the number of data CBs, from among the plurality of data CBs, for which decoding has failed; and transmitting the number of parity CBs, determined on the basis of the number of data CBs for which the decoding has failed, to the at least one receiving device in a retransmission step. Therefore, the resources required for retransmission can be reduced.

15 Claims, 30 Drawing Sheets

(58) Field of Classification Search
CPC ......... H03M 13/6356; H03M 13/1102; H03M 13/13; H03M 13/1515
USPC ....................................................... 370/328
See application file for complete search history.

(56) References Cited

U.S. PATENT DOCUMENTS

| | | | | |
|---|---|---|---|---|
| 11,356,205 | B2* | 6/2022 | Guan | H04L 1/1835 |
| 2011/0099446 | A1* | 4/2011 | Murakami | H04L 1/1887 |
| | | | | 714/E11.131 |
| 2016/0173232 | A1* | 6/2016 | Mallik | H04L 1/1819 |
| | | | | 714/800 |
| 2016/0285589 | A1* | 9/2016 | Mukkavilli | H04L 1/0045 |
| 2017/0279560 | A1* | 9/2017 | Murakami | H04L 1/0057 |
| 2017/0286221 | A1* | 10/2017 | Azogui | G06F 11/1048 |
| 2018/0048421 | A1 | 2/2018 | Yeo et al. | |
| 2018/0159660 | A1* | 6/2018 | Jia | H04L 1/18 |
| 2018/0262303 | A1* | 9/2018 | Jia | H04L 1/0058 |
| 2019/0190654 | A1* | 6/2019 | You | H04L 5/0007 |
| 2020/0028640 | A1 | 1/2020 | Yeo et al. | |

FOREIGN PATENT DOCUMENTS

| | | |
|---|---|---|
| IN | 201714028688 | 2/2018 |
| KR | 1020170095221 | 8/2017 |
| KR | 1020170128309 | 11/2017 |
| KR | 1020180013673 | 2/2018 |
| KR | 1020180018188 | 2/2018 |
| KR | 1020180035657 | 4/2018 |

OTHER PUBLICATIONS

European Search Report dated May 19, 2021 issued in counterpart application No. 19803363.1-1205, 11 pages.
PCT/ISA/210 Search Report issued on PCT/KR2019/005811, dated Aug. 12, 2019, pp. 5.
PCT/ISA/237 Written Opinion issued on PCT/KR2019/005811, dated Aug. 12, 2019, pp. 5.

* cited by examiner

APPARATUS AND METHOD FOR PERFORMING RETRANSMISSION IN WIRELESS COMMUNICATION SYSTEM

PRIORITY

This application is a National Phase Entry of International Application No. PCT/KR2019/005811, which was filed on May 15, 2019, and claims priority to Korean Patent Application No. 10-2018-0055527, filed in the Korean Intellectual Property Office on May 15, 2018, the entire content of each of which is incorporated herein by reference.

TECHNICAL FIELD

The disclosure relates to a wireless communication system and, more particularly, to a method and an apparatus for performing retransmission in a wireless communication system.

BACKGROUND ART

To meet the demand for wireless data traffic having increased since deployment of 4th generation (4G) communication systems, efforts have been made to develop an improved 5th generation (5G) or pre-5G communication system. Therefore, the 5G or pre-5G communication system is also called a 'beyond 4G network' or a 'post long term evolution (LTE) System'.

The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), full dimensional MIMO (FD-MIMO), array antenna, an analog beam forming, large scale antenna techniques are discussed in 5G communication systems.

In addition, in 5G communication systems, development for system network improvement is under way based on advanced small cells, cloud radio access networks (RANs), ultra-dense networks, device-to-device (D2D) communication, wireless backhaul, moving network, cooperative communication, coordinated multi-points (CoMP), reception-end interference cancellation and the like.

In the 5G system, Hybrid frequency shift keying (FSK) and quadrature amplitude modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

In a wireless communication system (e.g., a 5G communication system or a new radio (NR) system), a transmission device may retransmit a code block (CB) that a reception device fails to decode. If a single transmission device transmits data to a plurality of reception devices, CBs that reception devices fail to decode may be different from each other. Accordingly, as the number of reception devices, to which the single transmission device transmits data, is increased, the number of CBs which require retransmission may be increased.

DISCLOSURE OF INVENTION

Technical Problem

Therefore, the disclosure has been made in view of the above-mentioned problems, and an aspect of the disclosure is to provide a method and apparatus for performing retransmission in a wireless communication system.

An aspect of the disclosure is to provide a method and apparatus for performing retransmission using an outer code in a wireless communication system.

An aspect of the disclosure is to provide a method and apparatus for configuring feedback information in a wireless communication system.

An aspect of the disclosure is to provide a method and apparatus for indicating the number of CBs transmitted and the types of CBs transmitted.

An aspect of the disclosure is to provide a method and apparatus for indicating a resource region to which CBs are allocated.

Solution to Problem

According to various embodiments of the disclosure, an operation method of a transmission device in a wireless communication system may include: transmitting a plurality of data code blocks (CBs) to at least one reception device at initial transmission; receiving feedback information including information indicating the number of data CBs of which decoding fails among the plurality of data CBs, from the at least one reception device; and transmitting parity CBs of which the number is determined based on the number of CBs of which decoding fails, to the at least one reception device at retransmission.

According to various embodiments of the disclosure, an operation method of a reception device in a wireless communication system may include: receiving, from a transmission device, a plurality of data code blocks (CBs) at initial transmission: transmitting, to the transmission device, feedback information including information indicating the number of data CBs of which decoding fails among the plurality of data CBs; and receiving parity CBs of which a number is determined based on the number of data CBs of which decoding fails, from the transmitting device at retransmission.

According to various embodiments of the disclosure, a transmission device in a wireless communication system may include a transceiver configured to: transmit a plurality of data code blocks (CBs) to at least one reception device at initial transmission: receive feedback information including information indicating the number of data CBs of which decoding fails among the plurality of data CBs, from the at least one reception device; and transmit parity CBs of which the number is determined based on the number of CBs of which decoding fails, to the at least one reception device at retransmission.

According to various embodiments of the disclosure, a reception device in a wireless communication system may include a transceiver configured to: receive, from a transmission device, a plurality of data code blocks (CBs) at initial transmission; transmit, to the transmission device, feedback information including information indicating the number of data CBs of which decoding fails among the plurality of data CBs; and receive parity CBs of which a number is determined based on the number of data CBs of which decoding fails, from the transmitting device at retransmission.

Advantageous Effects of Invention

A method and apparatus according to various embodiments may transmit, to a transmission device, feedback information including information indicating the number of data code blocks (CBs) that a reception device fails to decode, and thus can reduce the number of bits of the feedback information.

A method and apparatus according to various embodiments may transmit parity CBs, produced by applying an outer code, at retransmission, and thus can reduce the number of CBs which require retransmission, and can reduce a resource required for retransmission.

Advantageous effects obtainable from the disclosure may not be limited to the above mentioned effects, and other effects which are not mentioned may be clearly understood, through the following descriptions, by those skilled in the art to which the disclosure pertains.

BEST MODE FOR CARRYING OUT THE INVENTION

Figure 1:
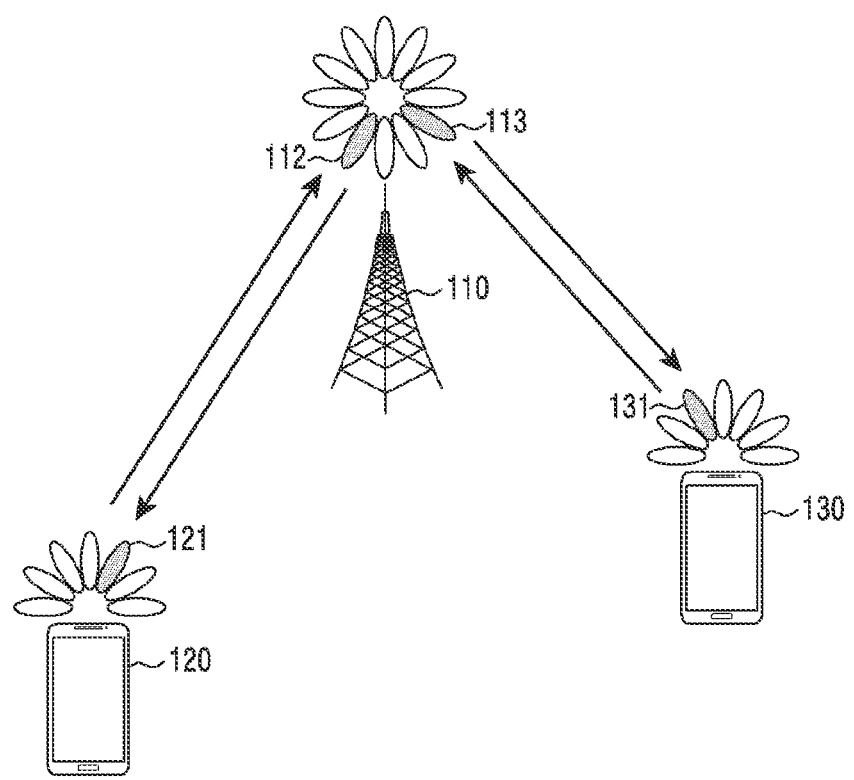
FIG. 1 is a diagram illustrating a wireless communication system according to various embodiments of the disclosure.

The terms used in the disclosure are only used to describe specific embodiments, and are not intended to limit the disclosure. A singular expression may include a plural expression unless they are definitely different in a context. Unless defined otherwise, all terms used herein, including technical and scientific terms, have the same meaning as those commonly understood by a person skilled in the art to which the disclosure pertains. Such terms as those defined in a generally used dictionary may be interpreted to have the meanings equal to the contextual meanings in the relevant field of art, and are not to be interpreted to have ideal or excessively formal meanings unless clearly defined in the disclosure. In some cases, even the term defined in the disclosure should not be interpreted to exclude embodiments of the disclosure.

Hereinafter, various embodiments of the disclosure will be described based on an approach of hardware. However, various embodiments of the disclosure include a technology that uses both hardware and software, and thus the various embodiments of the disclosure may not exclude the perspective of software.

The disclosure provided below relates to a method and an apparatus for performing retransmission in a wireless communication system. Particularly, the disclosure describes a technology for performing retransmission using an outer code in a wireless communication system.

In the following description, terms referring to signals, terms referring to channels, terms referring to control information, terms referring to network entities, terms referring to device elements, and the like are illustratively used for the sake of convenience. Therefore, the disclosure is not limited by the terms as used below, and other terms referring to subjects having equivalent technical meanings may be used.

In the disclosure, a downlink (DL) is a wireless transmission path of a signal that a base station (BS) transmits to a terminal. An uplink is a wireless transmission path of a signal that a terminal transmits to a BS. In addition, although it is described that the embodiments of the disclosure are applied to an NR system, the embodiments of the disclosure are also applicable to other communication systems having similar technical backgrounds or channel types. In addition, the embodiments of the disclosure may be modified by those skilled in the art without departing from the scope of the disclosure, and may be applied to other communication systems.

In the disclosure, terms "physical channel" and "signal" may be interchangeably used with terms "data" or "control signal". For example, although a physical downlink shared channel (PDSCH) is a physical channel via which data is transmitted, the PDSCH in the disclosure may refer to data.

In the disclosure, transmission of data may be considered as transmission of a physical channel for data transmission, such as a PDSCH, a physical uplink shared channel (PUSCH), or a physical sidelink shared channel (PSSCH).

In the disclosure, control information may refer to a physical control channel such as a physical downlink control channel (PDCCH), a physical sidelink control channel (PSCCH), and the like, or may refer to downlink control information (DCI) or sidelink control information (SCI).

In the disclosure, higher signaling (or higher layer signaling) is a method for signal transmission performed from a BS to a terminal using a downlink data channel in a physical layer, or a method of signal transmission performed from a terminal to a BS using an uplink data channel in a physical layer, and may be referred to as radio resource control (RRC) signaling or MAC control element (CE) signaling.

Although the disclosure describes various embodiments using terms defined in some communication standards (e.g., $3^{rd}$ generation partnership project (3GPP)), the embodiments are merely examples. Various embodiments of the disclosure may be easily modified and applied to other communication systems.

Hereinafter, embodiments of the disclosure will be described in detail with reference to the accompanying drawings.

In describing the embodiments of the disclosure, descriptions related to technical contents, which are well-known in the art to which the disclosure pertains, and are not directly associated with the disclosure, will be omitted. This is to omit unnecessary description and to more clearly describe the subject matter of the disclosure.

For the same reason, some elements in the attached drawings may be exaggerated, omitted, or briefly described. In addition, the size of each element does not fully reflect the actual size thereof. In the drawings, the same or corresponding elements are assigned with the same reference numbers.

The merits and features of the disclosure, and a method of achieving the same will be clearly understood by making reference to the embodiments described in detail together with the enclosed drawings. However, the disclosure is not limited to the embodiments described below, but may be implemented in various different ways. The embodiments are provided to enable the disclosure to be complemented, and to completely show the scope of the disclosure to those skilled in the art. The disclosure is only defined by the scope of the claims. Throughout the specification, the same reference numerals refer to the same element.

In this instance, it may be understood that each block in flowcharts and combinations of the flowcharts may be performed by computer program instructions. Those computer program instructions may be contained in a processor in a general-purpose computer, special computer, or other programmable data processing equipment. Accordingly, the instructions, performed by the processor of the computer or other programmable data processing equipment, may produce a means for implementing functions described in the flowchart block(s). Those computer program instructions may be stored in a computer-usable or computer-readable memory oriented to a computer or other programmable data processing equipment in order to implement functions in a predetermined manner. Accordingly, the instructions, stored in the computer-usable or computer-readable memory, are capable of producing a manufactured item including an instruction means that implements the functions described in the flowchart block(s). The computer program instructions may be contained in a computer or other programmable data processing equipment. Accordingly, the instructions that produce a process, which is executed via the computer after a series of operations are performed in the computer or other programmable data processing equipment, and operate the computer or other programmable data processing equipment, may provide steps for executing the functions described in the flowchart block(s).

In addition, each block may refer to a part of a module, segment, or code that includes one or more executable instructions for executing a predetermined logical function(s). In addition, according to some substitute examples, functions in blocks may be performed in a different order. For example, two consecutive two blocks may be performed at the substantially same time, or may be performed in reverse order depending on a corresponding function.

In this instance, the term, "unit", used in embodiments may refer to a software element or a hardware element such as "FPGA" or "ASIC", and "unit" may perform some functions. However, "unit" is not limited to software or hardware. "unit" may be configured to be contained in an addressable storage medium, or may be configured to reproduce one or more processors. Therefore, for example, "unit" may include elements, such as software elements, object-oriented software elements, class elements, and task elements, processes, functions, attributes, procedures, subroutines, segments of a program code, drivers, firmware, microcode, circuit, data, database, data structures, tables, arrays, and variables. A function provided in the elements and "units" may be implemented by coupling the functions of a smaller number of elements and "units" or may be implemented by separating the function to additional elements and "units". In addition, elements and "units" may be configured to reproduce one or more CPUs within a device or secure multimedia card. In addition, "unit" in an embodiment may include one or more processors.

FIG. 1 is a diagram illustrating a wireless communication system according to various embodiments of the disclosure. FIG. 1 illustrates a base station 110, a terminal 120, and a terminal 130, as some of the nodes that use wireless channels in a wireless communication system. Although FIG. 1 illustrates a single base station, another base station which is the same as or similar to the base station 110 may be further included.

The base station 110 may be a network infrastructure and/or a network node that provides radio access to terminals 120 and 130. The base station 110 may have coverage defined by a predetermined geographical area based on a distance to which the base station 110 is capable of transmitting a signal. The BS 110 may be referred to as an "access point (AP)", "eNodeB (eNB)", "gNodeB (gNB)", "$5^{th}$ generation node", "wireless point", "transmission/reception point (TRP)", "radio access unit", or other terms having meanings equivalent thereto, in addition to a "base station". In addition, the base station 110 may be a base station controller that controls another base station.

Each of the terminals 120 and 130 may be a device used by a user, and may communicate with the base station 110 via a wireless channel. Depending on the case, at least one of the terminals 120 and 130 may operate without any involvement of a user. That is, at least one of the terminals 120 and 130 is a device that performs machine type communication (MTC), and may not be carried by a user. Each of the terminals 120 and 130 may be referred to as a "user equipment (UE)", "mobile station", "subscriber station", "remote terminal", "wireless terminal", "user device", "cellular phone", "computer", a multimedia system capable of performing a communication function, or other terms having meanings equivalent thereto, in addition a "terminal". For ease of description, the terminal 120 is described, and the description associated with the terminal 120 is equivalently applied to a description associated with the terminal 130.

The base station 110, the terminal 120, and the terminal 130 may transmit and receive wireless signals in a millimeter wave (mmWave) band (e.g., 28 GHz, 30 GHz, 38 GHz, and 60 GHz). In this instance, in order to improve a channel gain, the base station 110, the terminal 120, and the terminal 130 may perform beamforming. Here, the beamforming may include transmission beamforming and reception beamforming. That is, the base station 110, the terminal 120, and the terminal 130 may assign directivity to a transmission signal or a reception signal. To this end, the base station 110 and the terminals 120 and 130 may select serving beams 112, 113, 121, and 131 via a beam search or beam management procedure. After the serving beams 112, 113, 121, and 131 are selected, communication may be performed via resources which are in a quasi-co-located (QCL) relationship with resources used for transmitting the serving beams 112, 113, 121, and 131.

If the base station 110 and the terminal 120 communicate with each other, one of the base station 110 and the terminal 120 may be a transmission device, and the other one is a reception device. For example, in the case of downlink communication in which the base station 110 transmits a signal to the terminal 120, the base station 110 may be a transmission device and the terminal 120 may be a reception device. As another example, in the case of uplink communication in which the terminal 120 transmits a signal to the base station 110, the terminal 120 may be a transmission device and the base station 110 may be a reception device. In other words, according to various embodiments of the disclosure, a transmission device and a reception device may be determined depending on the direction in which a signal is received, and the function of each entity is not restricted depending on the direction in which a signal is received.

Figure 2:
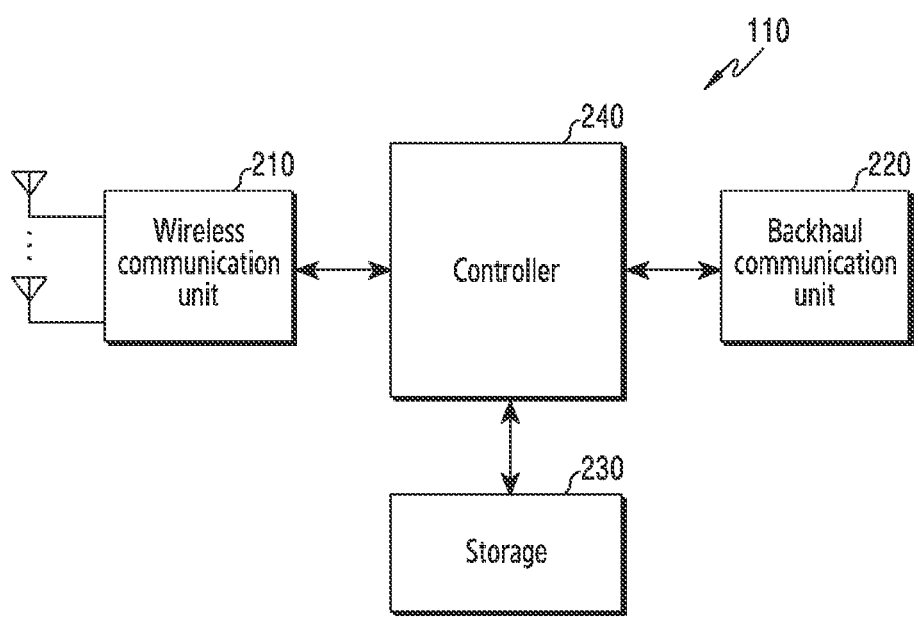
FIG. 2 is a diagram illustrating the configuration of a base station in a wireless communication system according to various embodiments of the disclosure.

FIG. 2 is a diagram illustrating the configuration of a base station in a wireless communication system according to various embodiments of the disclosure. The configuration of FIG. 2 may be understood as the configuration of the base station 110. The ending "unit" or "er" used hereinafter may refer to a unit for processing at least one function or operation and may be implemented as hardware, software, or a combination of hardware and software.

Referring to FIG. 2, the base station may include a wireless communication unit 210, a backhaul communication unit 220, a storage 230, and a controller 240.

The wireless communication unit 210 performs functions for transmitting or receiving a signal via a wireless channel. For example, the wireless communication unit 210 performs a function of conversion between a baseband signal and a bitstream according to the physical layer standard of the system. For example, in the case of data transmission, the wireless communication unit 210 produces complex symbols by encoding and modulating a transmission bitstream. In addition, in the case of data reception, the wireless communication unit 210 restores a reception bitstream by demodulating and decoding a baseband signal.

In addition, the wireless communication unit 210 up-converts a baseband signal into a radio-frequency (RF) band signal and transmits the same via an antenna, and down-converts an RF band signal received via an antenna into a baseband signal. To this end, the wireless communication unit 210 may include a transmission filter, a reception filter, an amplifier, a mixer, an oscillator, a digital-to-analog convertor (DAC), an analog-to-digital convertor (ADC), and the like. In addition, the wireless communication unit 210 may include a plurality of transmission/reception paths. In addition, the wireless communication unit 210 may include at least one antenna array including a plurality of antenna elements.

From the perspective of hardware, the wireless communication unit 210 may be configured with a digital unit and an analog unit. The analog unit may include a plurality of sub-units depending on an operating power, an operating frequency, or the like. The digital unit may be implemented as at least one processor (e.g., a digital signal processor (DSP)).

The wireless communication unit 210 may transmit or receive a signal as described above. Accordingly, the entirety or a part of the wireless communication unit 210 may be referred to as a "transmitter", "receiver", or "transceiver". In addition, the transmission and reception performed via a wireless channel, which is described in the following descriptions, may be understood to mean that the above-described processing is performed by the wireless communication unit 210.

The backhaul communication unit 220 provides an interface for performing communication with other nodes within the network. That is, the backhaul communication unit 220 converts a bitstream transmitted from a base station to another node, for example, another access node, another base station, a higher node, a core network, or the like, into a physical signal, and converts a physical signal received from another node into a bitstream.

The storage 230 may store data, such as a basic program for operating a base station, an application program, configuration information, and the like. The storage 230 may be configured as a volatile memory, a non-volatile memory, or a combination of a volatile memory and a non-volatile memory. In addition, the storage 230 may provide data stored therein in response to a request from the controller 240.

The controller 240 controls overall operation of the base station. For example, the controller 240 may transmit and receive a signal via the wireless communication unit 210 or the backhaul communication unit 220. Further, the controller 240 records data in the storage 230 and reads the recorded data. The controller 240 may perform the functions of a protocol stack that the communication standard requires. Depending on implementation, the protocol stack may be included in the wireless communication unit 210. To this end, the controller 240 may include at least one processor.

According to various embodiments, the controller 240 may perform control so that the wireless communication unit 210 transmits a plurality of data code blocks (CBs) to at least one reception device at initial transmission, receive feedback information including information indicating the number of data CBs of which decoding fails among the plurality of data CBs from the at least one reception device, and transmits parity CBs of which the number is determined based on the number of data CBs of which decoding fails to the at least one reception device at retransmission. In addition, the controller 240 may perform control so that the base station performs operations according to various embodiments.

Figure 3:
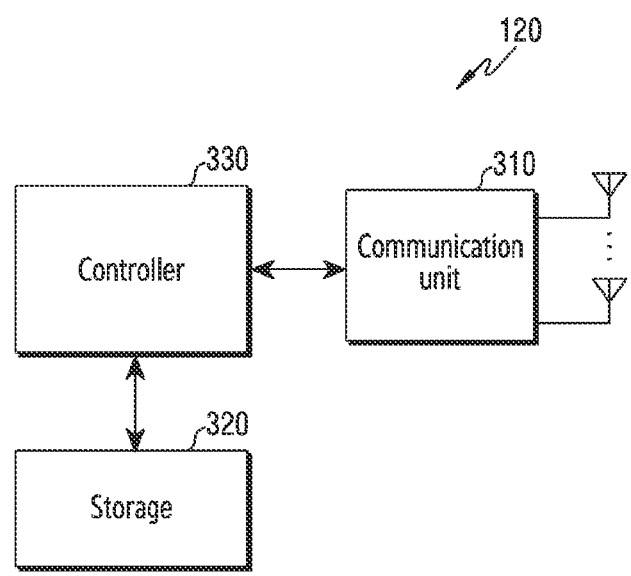
FIG. 3 is a diagram illustrating the configuration of a terminal in a wireless communication system according to various embodiments of the disclosure.

FIG. 3 is a block diagram illustrating the configuration of a terminal in a wireless communication system according to various embodiments of the disclosure. The configuration of FIG. 3 may be understood as the configuration of the terminal 120. The ending "unit" or "er" used hereinafter may refer to a unit for processing at least one function or operation and may be implemented as hardware, software, or a combination of hardware and software.

Referring to FIG. 3, the terminal includes a communication unit 310, a storage 320, and a controller 330.

The communication unit 310 performs functions for transmitting or receiving a signal via a wireless channel. For example, the communication unit 310 performs a function of conversion between a baseband signal and a bitstream according to the physical layer standard of a system. For example, in the case of data transmission, the communication unit 310 produces complex symbols by encoding and modulating a transmission bitstream. In addition, in the case of data reception, the communication unit 310 restores a reception bitstream by demodulating and decoding a baseband signal. In addition, the communication unit 310 up-converts a baseband signal into an RF band signal and transmits the same via an antenna, and down-converts an RF band signal received via an antenna into a baseband signal. For example, the communication unit 310 may include a transmission filter, a reception filter, an amplifier, a mixer, an oscillator, a DAC, an ADC, and the like.

In addition, the communication unit 310 may include a plurality of transmission/reception paths. In addition, the communication unit 310 may include at least one antenna array including a plurality of antenna elements. From the perspective of hardware, the communication unit 310 may include a digital circuit and an analog circuit (e.g., a radio frequency integrated circuit (RFIC)). Here, the digital circuit and the analog circuit may be implemented as a single package. In addition, the communication unit 310 may include a plurality of RF chains. In addition, the communication unit 310 may perform beamforming.

The communication unit 310 may transmit or receive a signal as described above. Accordingly, the entirety or apart of the communication unit 310 may be referred to as a "transmitter", "receiver", or "transceiver". In addition, the transmission and reception performed via a wireless channel, which is described in the following descriptions, may be understood to mean that the above-described processing is performed by the communication unit 310.

The storage 320 may store data, such as a basic program, an application program, configuration information, and the like for operating a terminal. The storage 320 may be configured as a volatile memory, a non-volatile memory, or a combination of a volatile memory and a non-volatile memory. In addition, the storage 320 may provide data stored therein in response to a request from the controller 330.

The controller 330 may control overall operation of a terminal. For example, the controller 330 may perform signal transmission and reception via the communication unit 310. Further, the controller 330 records data in the storage 320 and reads the recorded data. The controller 330 may perform functions of a protocol stack that the communication standard requires. To this end, the controller 330 may include at least one processor or micro-processor, or may be a part of the processor. In addition, a part of the communication unit 310 and the controller 330 may be referred to as a communication processor (CP).

According to various embodiments, the controller 330 may perform control so that the communication unit 310 receives a plurality of data code blocks (CBs) from a transmission device at initial transmission, transmits, to the transmission device, feedback information including information indicating the number of data CBs of which decoding fails among the plurality of data CBs, and receives parity CBs of which the number is determined based on the number of data CBs of which decoding fails, from the transmission device at retransmission stage. For example, the controller 330 may perform control so that the terminal performs operations according to various embodiments.

Figure 4:
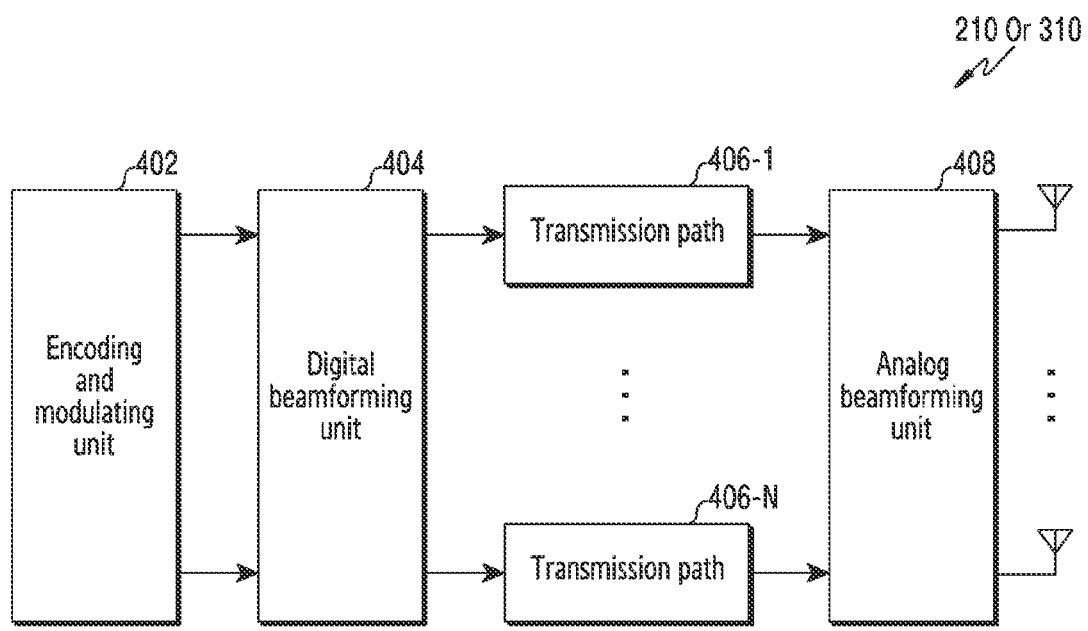
FIG. 4 is a diagram illustrating the configuration of a communication unit in a wireless communication system according to various embodiments of the disclosure.

FIG. 4 is a block diagram illustrating the configuration of a communication unit in a wireless communication system according to various embodiments of the disclosure. FIG. 4 illustrates an example of the detailed configuration of the wireless communication unit 210 of FIG. 2 or the communication unit 310 of FIG. 3. Particularly, FIG. 4 illustrates elements for performing beamforming, which are a part of the wireless communication unit 210 of FIG. 2 or the communication unit 310 of FIG. 3.

Referring to FIG. 4, the wireless communication unit 210 or the communication unit 310 may include an encoding and modulating unit 402, a digital beamforming unit 404, a plurality of transmission paths 406-1 to 406-N, and an analog beamforming unit 408.

The encoding and modulating unit 402 may perform channel encoding. To perform channel encoding, at least one of a low density parity check (LDPC) code, a convolution code, and a polar code may be used. The encoding and modulating unit 402 may perform constellation mapping, so as to produce modulated symbols.

The digital beamforming unit 404 may perform beamforming of a digital signal (e.g., modulated symbols). To this end, the digital beamforming unit 404 may multiply modulated symbols by beamforming weights. Here, the beamforming weights may be used for changing the sizes and the phases of signals, and may be referred to as a "precoding matrix", "precoder", and the like. The digital beamforming unit 404 may output digital-beamformed modulated symbols to the plurality of transmission paths 406-1 to 406-N. In this instance, according to a multiple input multiple output (MIMO) transmission scheme, the modulated symbols may be multiplexed or the modulated symbols may be provided to the plurality of transmission paths 406-1 to 406-N.

The plurality of transmission paths 406-1 to 406-N may change the digital-beamformed digital signals into analog signals. To this end, each of the plurality of transmission paths 406-1 to 406-N may include an inverse fast Fourier transform (IFFT) operation unit, a cyclic prefix (CP) insertion unit, a DAC, and an up-converter. The CP insertion unit is used for an orthogonal frequency-division multiplexing (OFDM) scheme, and may be excluded if another physical-layer scheme (e.g., filter bank multi-carrier (FBMC)) is applied. That is, the plurality of transmission paths 406-1 to 406-N may provide an independent signal processing process with respect to a plurality of streams produced by digital beamforming. Depending on an implementation scheme, some of the elements of the plurality of transmission paths 406-1 to 406-N may be used in common.

The analog beamforming unit 408 may perform beamforming with respect to analog signals. To this end, the digital beamforming unit 404 may multiply analog signals by beamforming weights. Here, the beamforming weights may be used for changing the sizes and the phases of signals.

Figure 5:
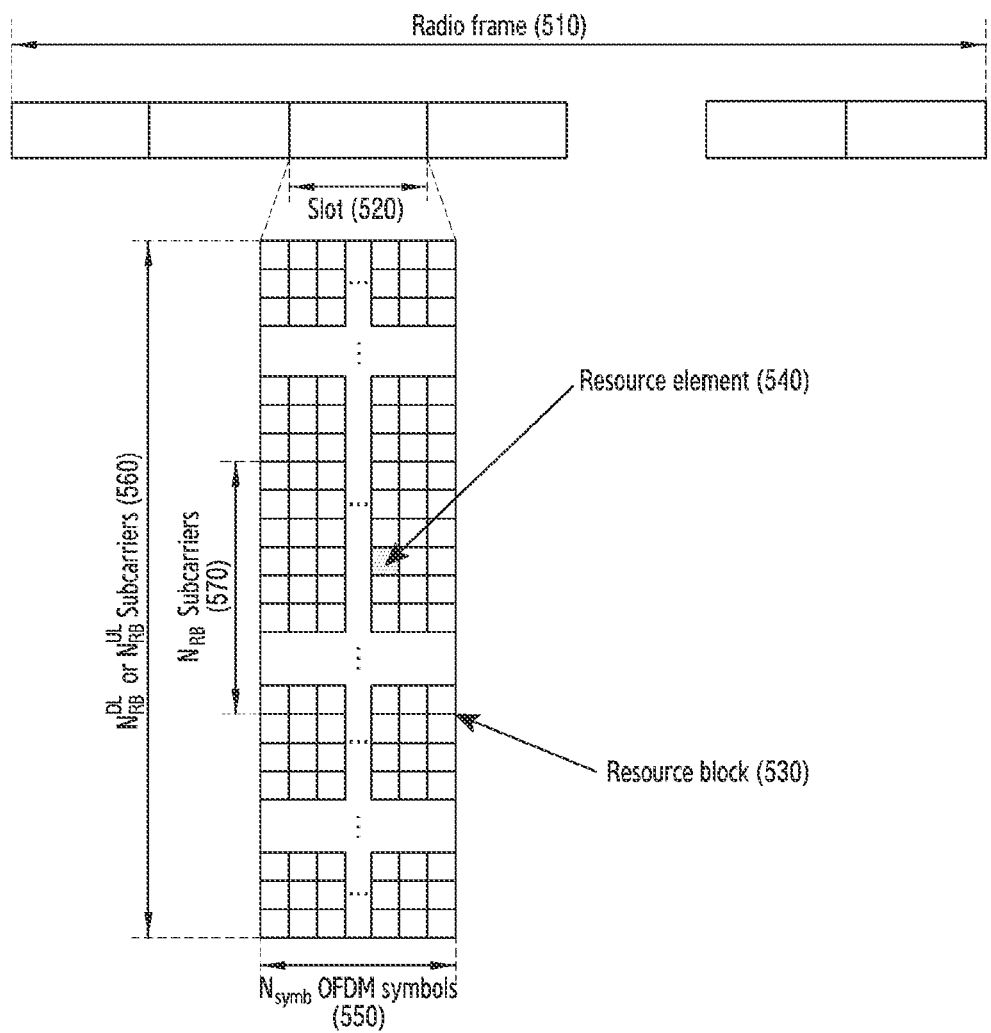
FIG. 5 is a diagram illustrating the structure of a radio resource in a wireless communication system according to various embodiments of the disclosure.

FIG. 5 is a block diagram illustrating the structure of a radio resource in a wireless communication system according to various embodiments of the disclosure. Referring to FIG. 5, the horizontal axis refers to time, and the vertical axis refers to frequency.

Referring to FIG. 5, in the wireless communication system, the minimum transmission unit in the time domain may be an OFDM symbol, and $N_{symb}$ OFDM symbols 550 may be a single slot 520. A plurality of slots, including the slot 520, may correspond to a single radio frame 510. Here, the time length of the radio frame 510 may be 10 ms, and the time length of a subframe may be 1.0 ms. The minimum transmission unit in the frequency domain is a subcarrier and the entire system transmission bandwidth includes a total of New subcarriers.

In the time-frequency domain, a basic resource unit may be a resource element (RE) (e.g., an RE 540). An RE may be expressed by an OFMD symbol index and a subcarrier index. A resource block (RB) (e.g., an RB 530) may be defined by $N_{symb}$ consecutive OFDM symbols in the time domain and $N_{RB}$ consecutive subcarriers 570 in the frequency domain. According to various embodiments, an RB may also be referred to as a physical resource block (PRB). Therefore, a single RB includes $N_{symb} \times N_{RB}$ REs. Generally, the minimum data transmission unit may be an RB. For example, in an NR system, $N_{symb}=14$ and $N_{RB}=12$, and $N_{BW}$ and $N_{RB}$ may be proportional to a system transmission band. A data rate may be increase in proportion to the number of RBs scheduled for a terminal. In the NR system, a downlink transmission bandwidth and an uplink transmission bandwidth may be different from each other in a frequency division duplex (FDD) system in which a frequency for downlink communication and a frequency for uplink communication are different from each other. A channel bandwidth may refer to a radio frequency (RF) bandwidth corresponding to a system transmission bandwidth. Table 1 shows a correlation between a channel bandwidth and a system transmission bandwidth defined in a legacy wireless communication system (e.g., an LTE system which is the 4G wireless communication) before the NR system. For example, in an LTE system having a channel bandwidth of 10 MHz, a transmission bandwidth may include 50 RBs.

TABLE 1

| | Channel bandwidth $BW_{Channel}$ [MHz] | | | | |
|---|---|---|---|---|---|
| | 1.4 | 3 | 5 | 10 | 15 | 20 |
| transmission bandwidth configuration $N_{RB}$ | 6 | 15 | 25 | 50 | 75 | 100 |

The NR system may support a bandwidth wider than the channel bandwidth of LTE shown in Table 1.

In the NR system, scheduling information associated with downlink data or uplink data may be transmitted from a base station to a terminal via downlink control information (DCI). Various types of DCI formats may be defined. Each format may indicate at least one piece of information among information indicating whether DCI includes scheduling information (UL grant) associated with uplink data or scheduling information (DL grant) associated with downlink data, information indicating whether DCI is compact DCI including small control information, information indicating whether spatial multiplexing that uses multiple antennas is applied, and information indicating whether DCI is DCI for controlling power. For example, DCI format 1-1 that includes scheduling control information associated with downlink data may include at least one piece of control information provided below:

Carrier indicator: indicates a carrier via which data is transmitted.

DCI format indicator: indicates whether DCI is associated with an uplink or a downlink.

Bandwidth part (BWP) indicator: indicates a BWP via which data is transmitted.

Frequency domain resource allocation: indicates an RB in the frequency domain, which is allocated for data transmission. A resource indicated by frequency domain resource allocation may be determined according to a system bandwidth and a resource allocation scheme.

Time domain resource allocation: indicates a slot and an OFDM symbol in which a channel related to data is transmitted.

Virtual RB (VRB)-to-PRB mapping: indicates a scheme of mapping a virtual RB index and a PRB index.

Modulation and coding scheme (MCS): indicates a modulation scheme (e.g., quadrature phase shift keying (QPSK), quadrature amplitude modulation (16QAM), 64QAM, 256QAM) and a coding rate (e.g., transport block size (TBS), channel coding information) used for data transmission.

Code block group (CBG) transmission information: indicates a CBG transmitted when CBG retransmission is configured.

Hybrid automatic repeat request (HARQ) process number: indicates a HARQ process number.

New data indicator: indicates whether the current transmission is initial HARQ transmission or HARQ retransmission.

Redundancy version (RV): indicates the RV of HARQ.

Transmit power control (TPC) command for physical uplink control channel (PUCCH): indicates a transmission power control command for a PUCCH which is an uplink control channel.

In the case of physical uplink shared channel (PUSCH) transmission, time domain resource allocation included in DCI format 1-1 may indicate information related to a slot in which a PUSCH is transmitted, the location (S) of a start symbol in the corresponding slot, and the number (L) of symbols onto which the PUSCH is mapped. Herein, S denotes the relative location from the start of a slot. L denotes the number of consecutive symbols. S and L may be determined based on a start and length indicator value (SLIV) defined as below.

If $(L-1) \leq 7$ then $SLIV=14 \cdot (L-1)+S$ else $SLIV=14 \cdot (14-L+1)+(14-1-S)$ where $0 < L \leq 14-S$ In the NR system, a terminal may be configured with a table including information associated with an SLIV value, a PUSCH mapping type, and a slot in which a PUSCH is transmitted, in a single row, via RRC configuration. The time domain resource allocation in DCI, which is transmitted after the table is configured, may indicate an index value in the configured table. By transmitting DCI indicating an index value in the configured table to a terminal, a base station may deliver, to the terminal, information associated with an SLIV value, a PUSCH mapping type, and a slot in which a PUSCH is transmitted.

In the NR system, a PUSCH mapping type may include type A and type B. According to PUSCH mapping type A, the first symbol of demodulation reference signal (DMRS) symbols may be located at the second or third OFDM symbol in a slot. According to PUSCH mapping type B, the first symbol of the DMRS symbols may be located at the first OFDM symbol in a time domain resource allocated for PUSCH transmission.

DCI may pass through a channel-coding and modulating process, and may be transmitted in a physical downlink control channel (PDCCH) which is a downlink physical control channel. According to various embodiments of the disclosure, a PDCCH may be briefly referred to as control information.

Generally, DCI may be scrambled with a predetermined radio network temporary identifier (RNTI) (or a UE identifier) independently for each terminal, a cyclic redundancy check (CRC) may be added to the scrambled DCI, and the DCI to which the CRC is added may be channel-coded, and may be transmitted in each independent PDCCH. A PDCCH may be mapped onto a control resource set (CORESET) configured for a terminal, and may be transmitted via the CORESET onto which the PDCCH is mapped.

Downlink data may be transmitted via a physical downlink shared channel (PDSCH) which is a physical channel for downlink data transmission. A PDSCH may be transmitted after a control channel transmission interval. A detailed mapping location of the PDSCH in the frequency domain, and modulation scheme and scheduling information associated with the PDSCH may be determined based on DCI transmitted via a PDCCH.

MCS among control information included in the DCI may indicate a modulation scheme applied to a PDSCH and the size of data (e.g., TBS) that a base station desires to transmit to a terminal. According to an embodiment, MCS may be expressed by 5 bits, or bits less or more than 5 bits. A TBS refers to a data size before channel coding for error correction is applied to data (e.g., TB) that a base station desires to transmit.

According to various embodiments of the disclosure, a TB may include at least one of a medium access control (MAC) header, a MAC control element (CE), at least one MAC service data unit (SDU), and padding bits. In addition, a TB may refer to a data unit or a MAC protocol data unit (PDU) which is transferred from a MAC layer to a physical layer.

A modulation scheme supported in the NR system may be quadrature phase shift keying (QPSK), 16QAM, 64QAM, 256QAM, and each modulation order (Qm) may be 2, 4, 6, and 8. That is, in the case of QPSK modulation, 2 bits are transmitted per symbol. In the case of 16QAM modulation, 4 bits are transmitted per symbol. In the case of 64QAM modulation, 6 bits are transmitted per symbol. In the case of 256QAM modulation, 8 bits are transmitted per symbol.

A wireless communication system is being developed to be a broadband wireless communication system that provides a high-speed and high-quality packet data service, like the communication standards, such as, high speed packet access (HSPA) of 3GPP, long term evolution (LTE) or evolved universal terrestrial radio access (E-UTRA), LTE-advanced (LTE-A), high rate packet data (HRPD) of 3GPP2, ultra mobile broadband (UMB), and 802.16e of IEEE, or the like, beyond the voice-based service provided at the initial stage. In addition, communication standard of 5G or new radio (NR) is being developed as a 5G wireless communication system.

As an example of a broadband wireless communication system, the NR system may employ an orthogonal frequency division multiplexing (OFDM) scheme in a downlink (DL) and an uplink (UL). Particularly, a cyclic-prefix OFDM (CP-OFDM) in the downlink is employed in a downlink, and a CP-OFDM scheme and a discrete Fourier transform spreading OFDM (DFT-S-OFDM) scheme are employed in the uplink. An uplink refers to a radio link in which a terminal, a UE, or an MS, transmits data or a control signal to a base station (e.g., a gNB), and a downlink refers to a radio link in which a base station transmits data or a control signal to a terminal. In a wireless communication system, such as the NR system, a multi-access scheme allocates time-frequency resources, in which data or control information for each user is to be transmitted, so as not to overlap to time-frequency resources of another user (i.e., to establish orthogonality). Accordingly, time-frequency resources in which data or control information for each user is to be transmitted may be distinguished from one another.

The new 5G communication or the NR system is designed to enable various services to be freely multiplexed in time and frequency resources. Accordingly, in the NR system, a waveform, a numerology, and/or a reference signal may be dynamically or freely allocated according to needs of a corresponding service. In order to provide an optimal service to a UE in wireless communication, it is required to perform data transmission optimized based on measurement of channel quality and interference. Accordingly, it is essential to accurately measure a channel state and/or a channel quality. The channel and interference characteristics are not dramatically changed depending on a frequency resource in a 4G communication system. However, unlike the 4G communication system, the channel and interference characteristics are dramatically changed depending on a service in the case of a 5G channel. Accordingly, a resource unit, such as a frequency resource group (FRG), may be required in order to separately measure channel and interference characteristics for each frequency resource.

The types of services supported in the NR system may include enhanced mobile broadband (eMBB), massive machine type communications (mMTC), and ultra-reliable and low-latency communications (URLLC). eMBB may be a service that targets high-speed transmission of high-capacity data. mMTC may be a service that targets minimizing power consumption by a terminal and access of multiple terminals. URLLC may be a service that targets high-reliability and low-latency. Different requirements may be applied depending on the type of service applied to a terminal.

As researches on the next generation communication system are being conducted, various methods for scheduling communication with a terminal are currently being discussed. Accordingly, there is a desire for an efficient scheduling and data transmission/reception scheme in consideration of the characteristics of the next generation communication system.

As described above, a plurality of services may be provided to a user in a communication system, and in order to provide the plurality of services to a user, there is a desire for a method and apparatus for providing respective services in the same time interval.

Figure 6A:
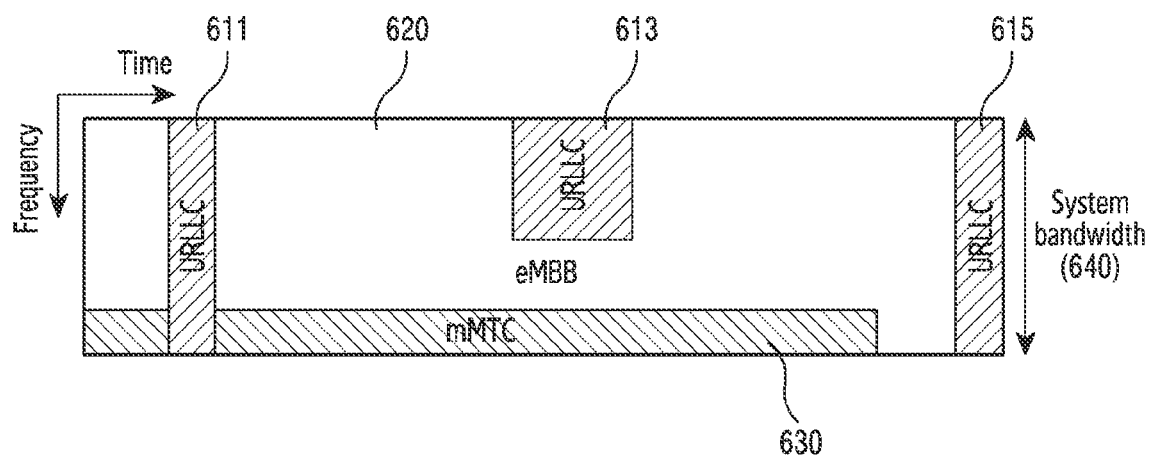
FIGS. 6A and 6B are diagrams illustrating allocation for various services in a resource region in a wireless communication system according to various embodiments of the disclosure.
Figure 6B:
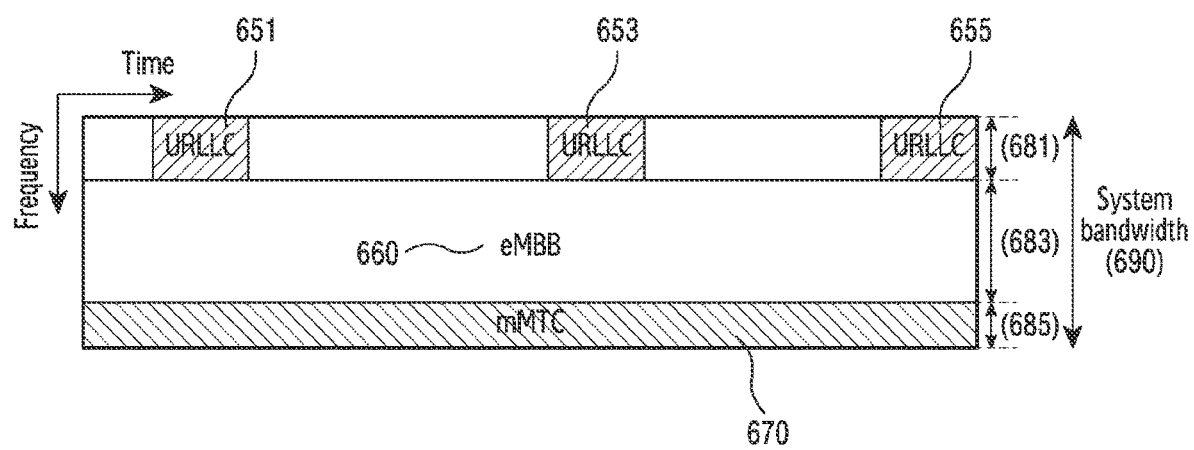

FIGS. 6A and 6B are diagrams illustrating allocation for various services in a resource region in a wireless communication system according to various embodiments of the disclosure. With reference to FIGS. 6A and 6B, a scheme of allocating frequency and time resources for transmitting information related to each service will be described.

Referring to FIG. 6A, data allocation for eMBB, URLLC, and mMTC in an entire system band 640 is illustrated. If URLLC data 611, 613, and/or 615 is produced in the state in which eMBB data 620 and mMTC data 630 are allocated in a predetermined frequency band, the allocation of the eMBB data 620 and mMTC data 630 may be deallocated, or eMBB data 620 and mMTC data 630 may not be transmitted. Accordingly, a transmission device may transmit the URLLC data 611, 613, and/or 615. A URLLC service among various services is required to reduce latency. Accordingly, URLLC data 611, 613, and/or 615 may be allocated in and transmitted via a part of the resource in which eMBB data 620 is allocated. If the URLLC data 611, 613, and/or 615 are additionally allocated and transmitted in the resource in which the eMBB data 620 is allocated, the eMBB data 620 may not be transmitted in the frequency-time resource in which the URLLC data 611, 613, and/or 615 are allocated. Accordingly, the transmission performance of the eMBB data 620 may deteriorate. In other words, due to the allocation of the URLLC data 611, 613, and/or 615, transmission of the eMBB data 620 may fail.

Referring to FIG. 6B, an entire system band 690 may be divided into subbands 681, 683, and 685, and each subband may be used for transmitting data related to each service. Information related to configuration associated with a subband may be determined in advance, or may be transmitted from a base station to a terminal via higher layer signaling. Alternatively, a base station or a network node may arbitrarily divide the system band 690 into subbands, and may provide a service via each subband without transmitting configuration information of the subband to a terminal. Referring to FIG. 6B, a subband 681 is used for transmitting URLLC data 651, 653, and/or 655. A subband 683 is used for transmitting eMBB data 660. A subband 685 is used for transmitting mMTC data 670.

According to various embodiments of the disclosure, the length of a transmission time interval (TTI) used for transmitting URLLC data may be shorter than the length of a TTI used for transmitting eMBB data and/or mMTC data. In addition, a response associated with the information related to URLLC may be rapidly transmitted than a response related to eMBB or mMTC. Accordingly, the information related to URLLC may be transmitted or received with low latency. The structures of physical layer channels used for transmitting eMBB data, mMTC data, and URLLC data may differ. For example, data transmission of eMBB, mMTC, and URLLC may have a difference in at least one of the length of a TTI, a frequency resource allocation unit, the structure of a control channel, and a data mapping method.

In the above-described embodiments, the type of services and/or data are limited to three types (e.g., eMBB, mMTC, and URLLC), these are merely examples. Many other types of services and data may be applicable. Various embodiments of the disclosure are not limited to the three types of services and data, and may be applicable to various types of services and data.

To describe various embodiments of the disclosure, terms related to the NR system may be used. However, various embodiments of the disclosure may be applicable to other wireless communication systems, in addition to the NR system.

Figure 7:
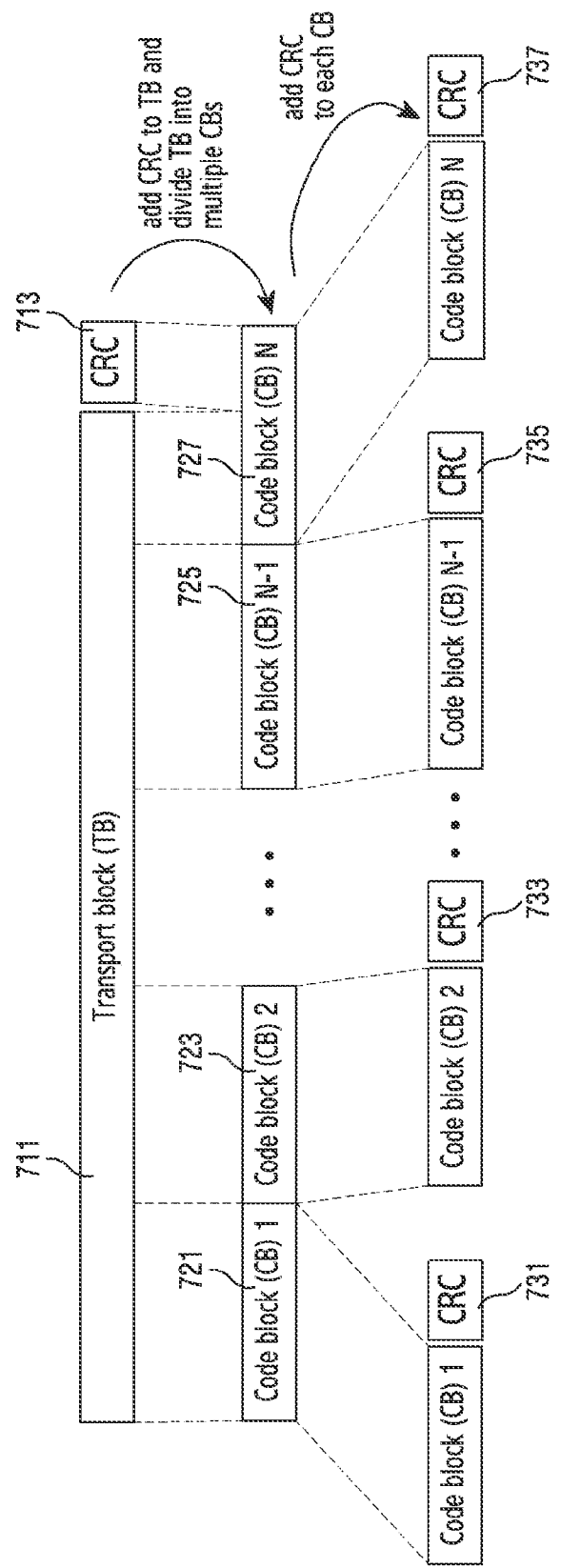
FIG. 7 is a diagram illustrating a process of obtaining a code blocks (CBs) from a transport block (TB) in a wireless communication system according to various embodiments of the disclosure.

FIG. 7 is a diagram illustrating a process of obtaining a code block (CB) from a TB in a wireless communication system according to various embodiments of the disclosure.

Referring to FIG. 7, a CRC 713 may be added to the front end or the rear end of a TB 711 desired to be transmitted in an uplink or a downlink. The CRC 713 may have 16 bits or 24 bits, or may have a predetermined number of bits, or may have a variable number of bits which are changed depending on a channel quality and/or channel state. The CRC 713 may be used for determining whether channel coding is successfully completed. A block obtained by adding the CRC 713 to the TB 711 may be divided into a plurality of CBs 721, 723, 725, and 727. The maximum size of CBs may be predetermined and the size of the last CB 727 may be smaller than the other CBs. If the size of the last CB 727 is smaller than the size of other CBs, "0", a random value, or "1" may be added to the last CB 727 so that the size of the last CB 727 becomes to be the same as those of the other CBs. A CRC may be added to each CB. For example, a CRC 731 may be added to the CB 721, a CRC 733 may be added to the CB 723, a CRC 735 may be added to the CB 725, and a CRC 737 may be added to the CB 727. The CRC 731, 733, 735, and/or 737 may have 16 bits, 24 bits, or a predetermined number of bits, and may be used for determining whether channel coding is successfully completed.

According to various embodiments of the disclosure, a CRC (e.g., the CRC 713) added to a TB and/or a CRC (e.g., the CRC 731, 733, 735, and/or 737) added to a CB may be omitted depending on the type of channel code to be applied to the corresponding CB. For example, if a low density parity check (LDPC) code which is different from a turbo code is applied to a CB, a CRC to be added to each CB may be omitted. According to another embodiment, even in the case in which LDPC is applied, a CRC may be added to a CB. As another example, if a polar code is applied, a CRC may be added to a CB, or may be omitted.

As illustrated in FIG. 7, the maximum length of each CB in a TB to be transmitted may be determined based on the type of channel coding applied, and the TB and the CRC added to the TB may be divided into CBs depending on the maximum length of the CB. In the LTE system, a CRC for a CB is added to a CB obtained via division, and the CRC and the data bits of the CB may be encoded based on a channel code and coded bits may be produced. Then, for the coded bits, the number of bits for rate matching may be determined according to a rule predetermined.

Figure 8:
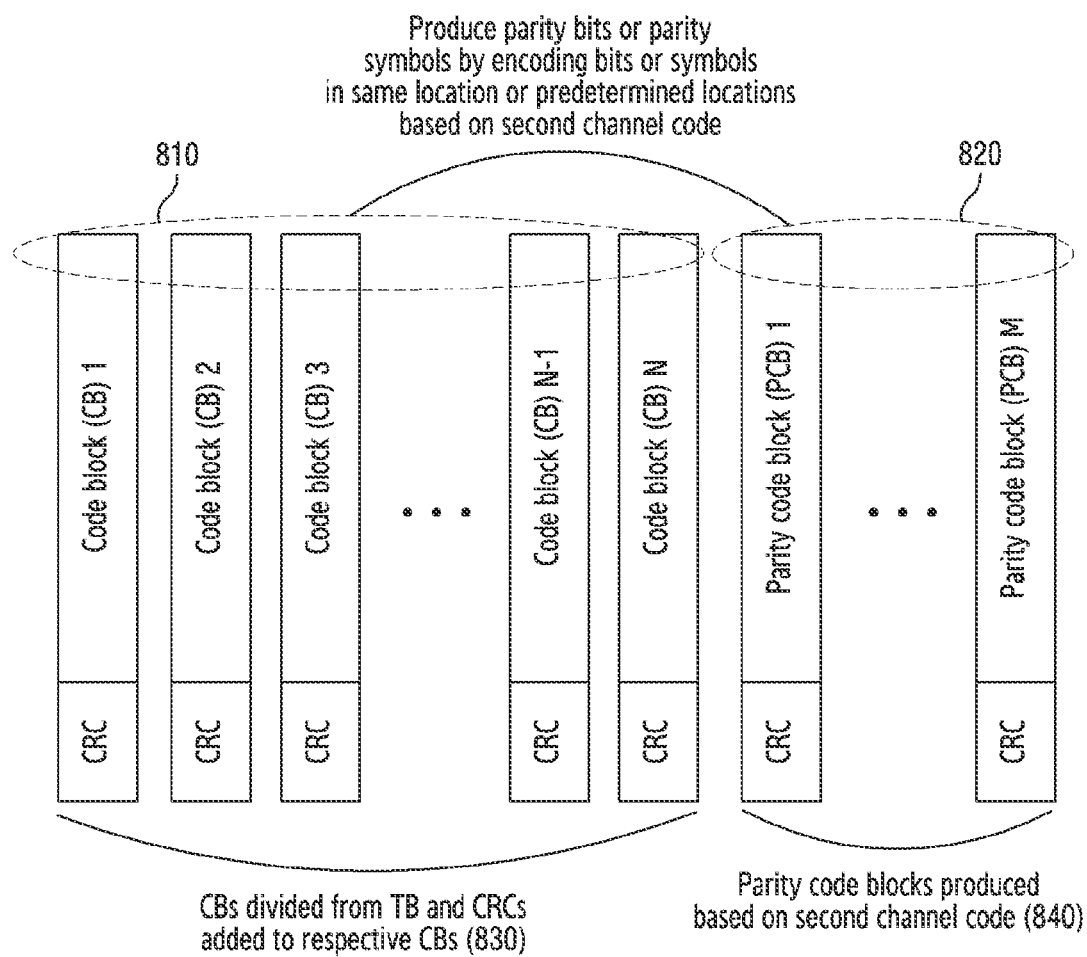
FIG. 8 is a diagram illustrating an example of the case of applying an outer code to CBs in a wireless communication system according to various embodiments of the disclosure.

FIG. 8 is a diagram illustrating an example of the case of applying an outer code to CBs in a wireless communication system according to various embodiments of the disclosure.

Referring to FIG. 8, a TB may be divided into a plurality of CBs. A transmission device may encode, based on a second channel code, bits or symbols 810 located in the same location in respective CBs, so as to obtain parity bits or parity symbols 820. According to various embodiments of the disclosure, the second channel code may be an outer code. If the transmission device encodes, based on the second channel code, the bits or symbols located in all locations of respective CBs, at least one parity code block (PCB) may be obtained. In other words, the transmission device may apply the second channel code to the CBs and may obtain at least one PCB. The transmission device may add a CRC to each CB and each PCB, and may obtain CBs 830 to which CRCs are added and PCBs 840 to which CRCs are added.

According to various embodiments of the disclosure, whether to add a CRC may be determined based on the type of channel code. For example, if a turbo code is used as a first channel code, a CRC may be added to a CB and/or a PCB. As another example, respective CBs and PCBs may be encoded based on the first channel code.

According to various embodiments of the disclosure, the first channel code may include at least one of a convolutional code, an LDPC code, a turbo code, and a polar code. The second channel code may include at least one of a Reed-Solomon code, a BCH (Bose, Chaudhuri, Hocquenghem) code, a raptor code, and a parity bit generation code.

Figure 9A:
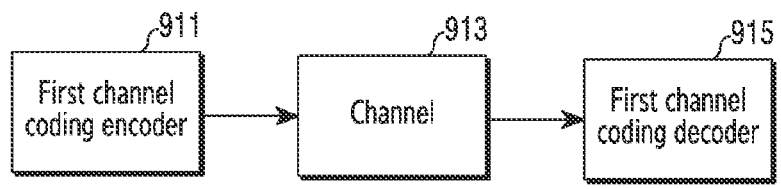
FIGS. 9A and 9B are diagrams illustrating a channel coding and decoding process based on whether an outer code is used in a wireless communication system according to various embodiments of the disclosure.
Figure 9B:
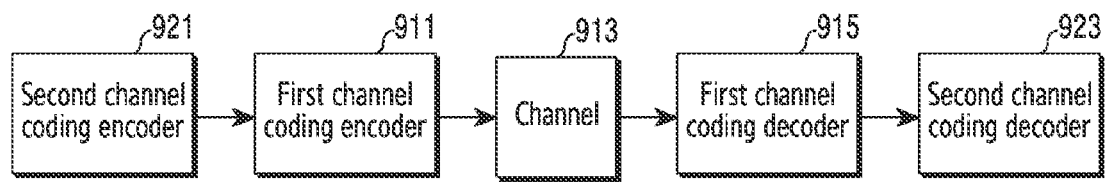

FIGS. 9A and 9B are diagrams illustrating a channel coding and decoding process based on whether an outer code is used in a wireless communication system according to various embodiments of the disclosure.

Referring to FIG. 9A, if an outer code is not used, a first channel coding encoder 911 of a transmission device and a first channel coding decoder 915 of a reception device are used in a signal transmission and reception procedure via a channel 913. A second channel coding encoder 921 of the transmission device and a second channel coding decoder 923 of the reception device may not be used. The first channel coding encoder 911 and the first channel coding decoder 915 in the case in which an outer code is not used may be configured to be the same as the case that uses an outer code.

Referring to FIG. 9B, if an outer code is used, data to be transmitted may pass through a second channel coding encoder 921. The bits or symbols that pass through the second channel coding encoder 921 may go through the first channel coding encoder 911. If the reception device receives symbols, channel-coded by the second channel coding encoder 921 and the first channel coding encoder 911, via the channel 913, the reception device may sequentially pass the received signal through the first channel coding decoder 915 and the second channel coding decoder 923. The first channel coding decoder 915 and the second channel coding decoder 923 may perform operations respectively corresponding to the first channel coding encoder 911 and the second channel coding encoder 921.

Figure 10:
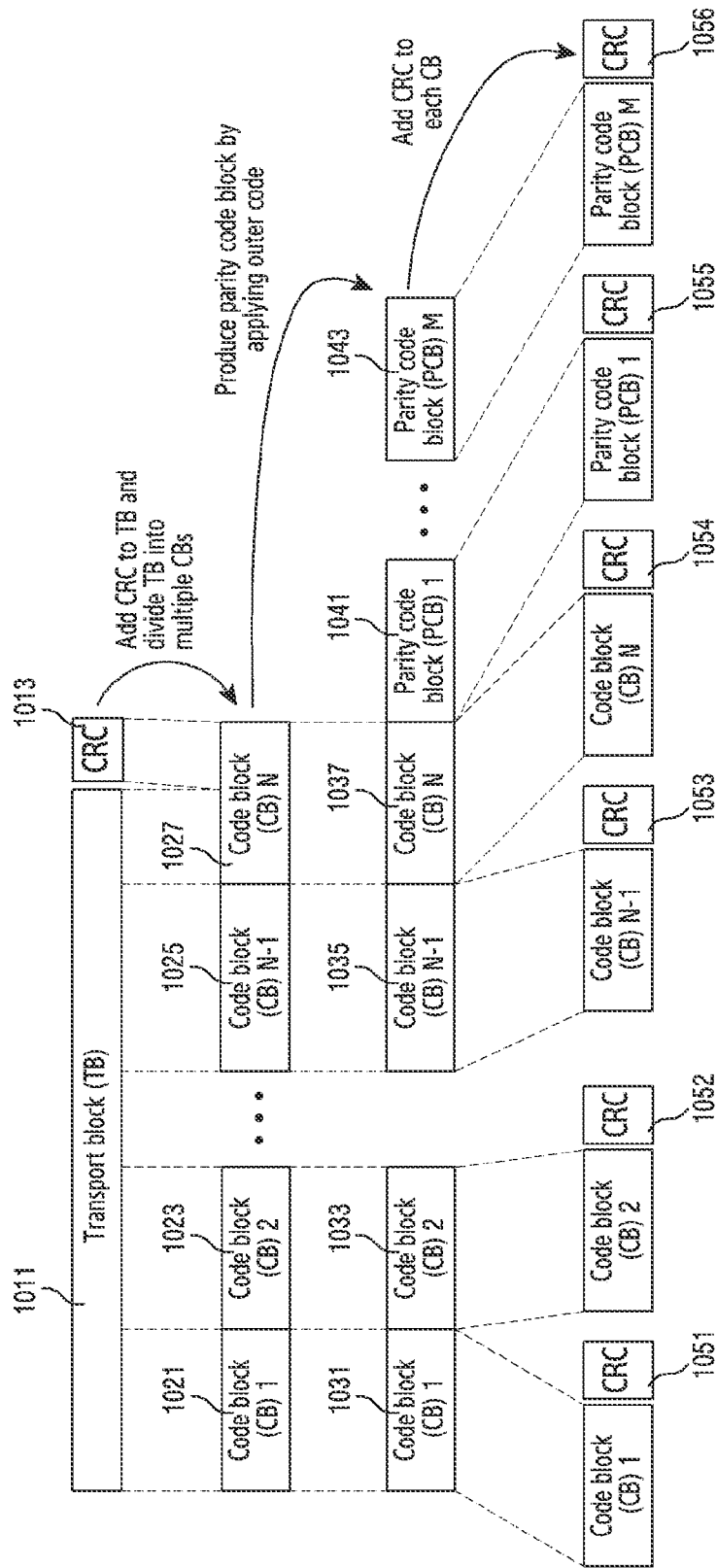
FIG. 10 is a diagram illustrating a process of obtaining CBs and PCBs in a wireless communication system according to various embodiments of the disclosure.

FIG. 10 is a diagram illustrating a process of obtaining CBs and PCBs in a wireless communication system according to various embodiments of the disclosure.

Referring to FIG. 10, a TB 1011 and the TB 1011 to which a CRC 1013 is added may be divided into at least one CB, which has been shown in FIG. 7. If a single CB is produced depending on the size of a TB, a CRC may not be added to the produced CB. If an outer code is applied to CBs 1021, 1023, 1025, and 1027 (or CBs 1031, 1033, 1035, and 1037) to be transmitted, CBs 1041 and 1043 may be produced.

According to various embodiments of the disclosure, CBs obtained by dividing a TB (or a TB to which a CRC is added), such as CBs 1021, 1023, 1025, and 1027 (or CBs 1031, 1033, 1035, and 1037), may be referred to as data CBs. CBs, such as CBs 1041 and 1043, produced by applying an outer code to the data CBs may be referred to as parity CBs (PCBs).

The PCBs 1041 and 1043 produced by applying an outer code may be located after the last CB 1037. After the outer code is applied, CRCs 1051, 1052, 1053, 1054, 1055, and 1056 may be added to respective CBs or PCBs. The CBs to which CRCs are added or PCBs to which CRCs are added may be encoded based on a channel code (e.g., a first channel code).

An NR system employs an HARQ scheme that retransmits data in a physical layer when decoding of the corresponding data fails at initial transmission. The HARQ scheme is a scheme in which a reception device transmits, to a transmission device, information (negative acknowledgement (NACK)) indicating that decoding fails if the reception device fails to decode data, so that the transmission device retransmits the corresponding data in the physical layer. The reception device may combine the data retransmitted from the transmission device and the data of which decoding fails, so as to increase the data reception performance. In addition, if the reception device successfully decodes the data, the reception device transmits, to the transmission device, information (acknowledgement (ACK)) indicating that decoding is successfully performed, so that the transmission device transmits new data.

In the NR system, a base station and/or a terminal may perform retransmission based on a code block group (CBG) unit which is a group of CBs. Unlike the above, in an LTE system, since a base station and/or a terminal performs retransmission based on a TB unit, all CBs included in the TB may need to be retransmitted at retransmission. Therefore, in the LTE system, a CB of which decoding is successfully performed may also be retransmitted. Conversely, in the NR system, in order to reduce transmission resources for retransmission, the base station may perform configuration for the terminal so that only a CBG, including a CB which requires retransmission, is retransmitted. If CBG unit-based retransmission is configured, CBG-related information may be included in DCI. The terminal may provide feedback in association with whether decoding of a predetermined CBG is successfully performed to the base station via one bit.

In the following description, there are provided a method and an apparatus for performing data transmission or reception between a base station and a terminal or between terminals, by applying an outer code. That is, in various embodiments of the disclosure, a transmission device may be a base station or a terminal, and a reception device(s) may be at least one terminal. In addition, the transmission device may be a terminal, and the reception device(s) may be at least one base station or at least one terminal. According to various embodiments of the disclosure, the transmission device may transmit data to a plurality of reception devices.

Figure 11A:
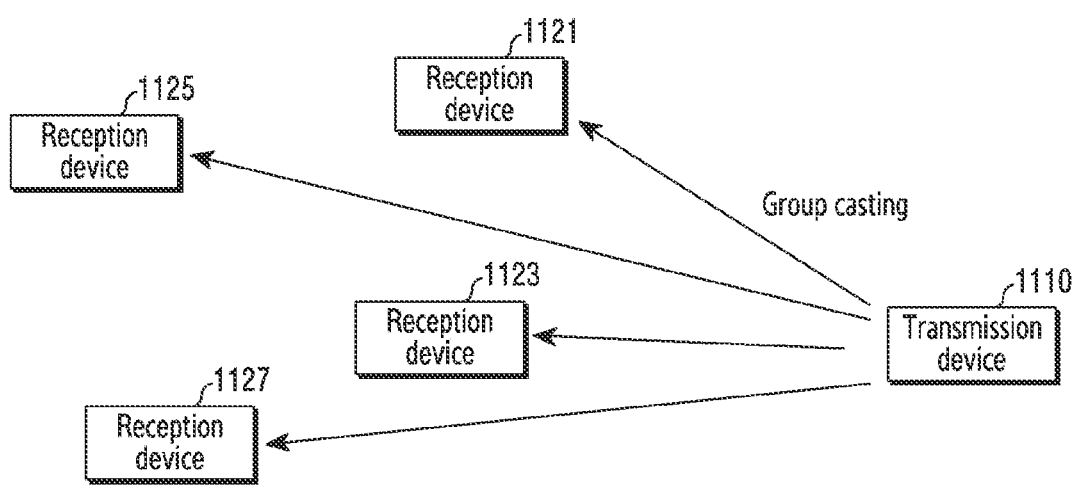
FIGS. 11A and 11B are diagrams illustrating examples of a signal flow between a single transmission device and a plurality of reception devices in a wireless communication system according to various embodiments of the disclosure.

For example, various embodiments of the disclosure may be applied to the case in which a single transmission device transmits data to a plurality of reception devices as shown in FIG. 11A. Referring to FIG. 11A, a transmission device 1110 may perform group cast of common data to a plurality of reception devices 1121, 1123, 1125, and 1127. The transmission device 1110 may be the base station 110 or the terminal 120, and the respective reception devices 1121, 1123, 1125, and 1127 may be terminals (e.g., the terminal 120). Control information, a physical control channel, and data may be separately transmitted for group casting. The reception devices 1121, 1123, 1125, and 1127 that receive common data via group casting may transmit information associated with the success or failure of data reception to the transmission device 1110. For example, the information related to the success or failure of data reception may include information such as a HARQ-ACK feedback. The transmission device and/or reception devices in FIGS. 11A and 11B may be terminals that move such as vehicles.

Figure 11B:
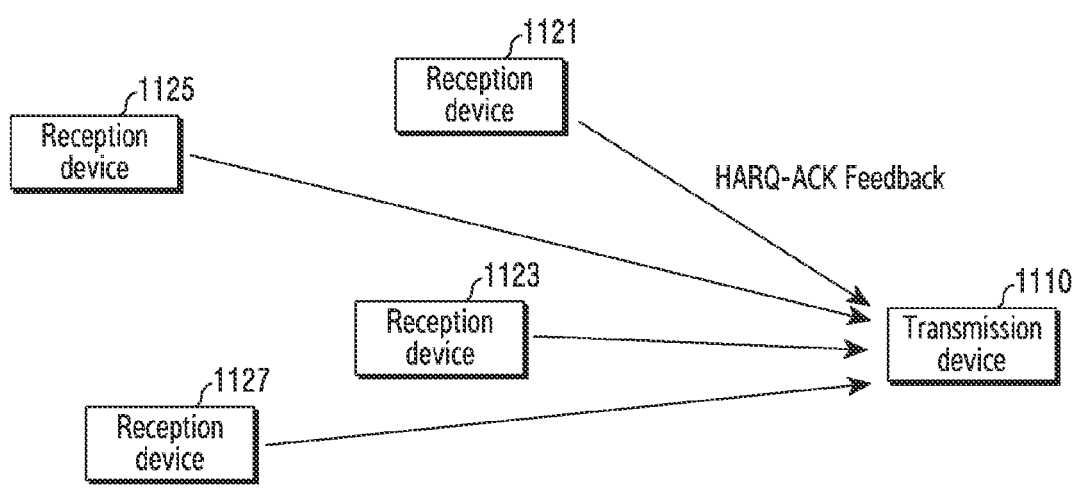

As illustrated in FIGS. 11A and 11B, if a single transmission device transmits data to a plurality of reception devices, data CBs that each of the plurality of reception devices fails to decode have a high probability of being different from each other. Accordingly, as the number of reception devices is increased, the number of data CBs that the transmission device needs to retransmit may be increased.

Therefore, various embodiments of the disclosure provide a method and apparatus for applying an outer code in order to reduce the number of CBs which require retransmission if a single transmission device transmits data to a plurality of reception devices.

Since CBs that a plurality of reception ends fails to decode have a high probability of being different from each other, as the number of reception ends is increased, the number of CBs needs to be retransmitted is increased. In the case in which an outer code is used, although CBs that each of the plurality of reception devices fails to decode are different from each other, the transmission device may transmit common parity CBs produced by applying the outer code to the plurality of reception devices, and the reception devices may be capable of restoring desired data CBs using the common parity CBs. To this end, the reception device may transmit information indicating the number of data CBs of which decoding fails, as opposed to information indicating the index of a data CB of which decoding fails. Accordingly, the number of bits of feedback information that the reception device transmits to the transmission device may be reduced.

Unlike the example shown in FIGS. 11A and 11B, various embodiments of the disclosure may also be applicable to the case in which a single transmission device transmits data to a single reception device. However, various embodiments of the disclosure are not limited to the above-mentioned examples and may be applied to various cases.

Hereinafter, embodiments for performing retransmission using an outer code, and providing feedback information for retransmission will be described. Hereinafter, although embodiments are provided under the assumption of downlink transmission or sidelink transmission for ease of description, various embodiments of the disclosure may be also applicable to uplink transmission.

Embodiment 1

Embodiment 1 describes an example in which a transmission device produces a parity block by applying an outer code for data transmission or reception, and transmits the parity block based on feedback from reception devices.

Figure 12:
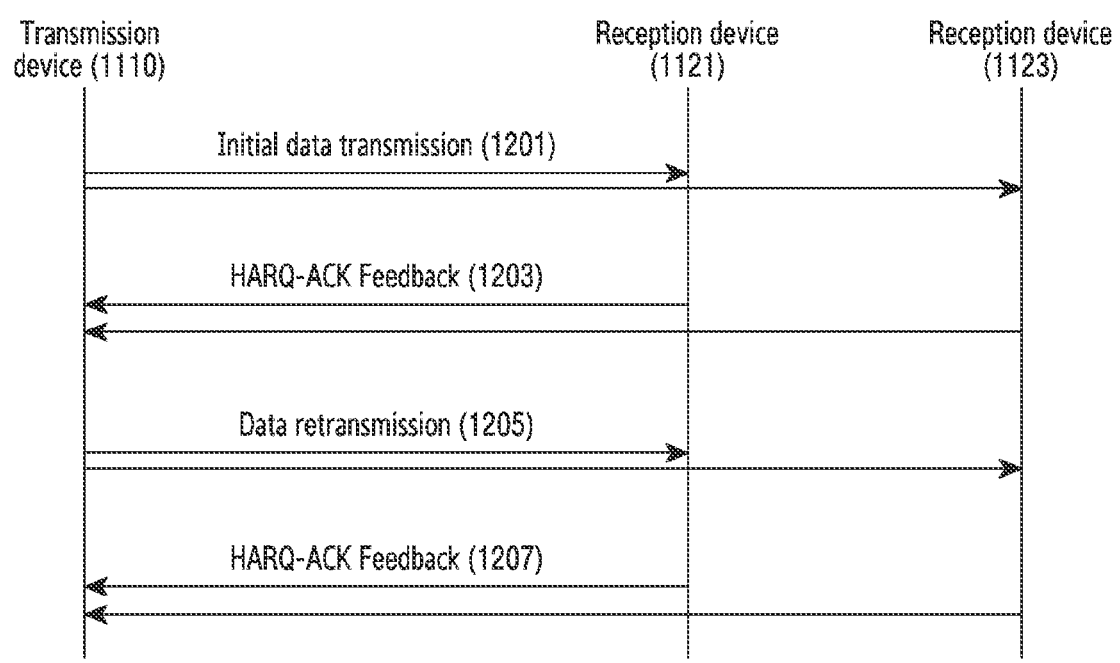
FIG. 12 is a signal flow illustrating a process of data transmission between a transmission device and reception devices in a wireless communication system according to various embodiments of the disclosure.

FIG. 12 is a signal flow illustrating a process of data transmission between a transmission device and reception devices in a wireless communication system according to various embodiments of the disclosure.

Referring to FIG. 12, in operation 1201, the transmission device 1110 transmits data to the reception device 1121 and the reception device 1123. Data transmission performed in operation 1201 may be initial data transmission. The transmission device 1110 may transmit data, delivered from a MAC layer, via a physical channel, and the physical channel may include a control channel. For example, the transmission device 1110 may transmit at least one TB to the reception devices 1121 and 1123. Each TB transmitted in operation 1201 may include at least one data CB.

In operation 1203, the reception device 1121 and the reception device 1123 may transmit feedback information such as a HARQ-ACK feedback to the transmission device 1110. The feedback information may include a result of decoding data corresponding to the initial transmission. For example, the feedback information may include information associated with the number of CBs of which decoding fails or the number of CBs of which decoding is successfully performed among CBs included in the data corresponding to the initial transmission. In other words, the feedback information may include information associated with the number of CBs of which decoding fails or the number of CBs of which decoding is successfully performed.

In operation 1205, the transmission device 1110 may transmit data CBs and/or parity CBs to the reception devices 1121 and 1123, based on the feedback information received in operation 1203. Data transmission performed in operation 1205 may be data retransmission. For example, the transmission device 1110 may retransmit parity CBs which were not transmitted at the initial transmission. The transmission device 1110 may determine the number of parity CBs to be transmitted at the retransmission, based on the feedback information. For example, if the feedback information includes information indicating the number of CBs that each reception device fails to decode, the transmission device 1110 may determine a number corresponding to the maximum value among the numbers of CBs that reception devices respectively fail to decode, to be the number of parity CBs to be transmitted at retransmission, and the transmission device 110 may transmit the determined number of parity CBs to the reception devices 1121 and 1123.

In operation 1207, the reception device 1121 and the reception device 1123 may transmit feedback information such as a HARQ-ACK feedback to the transmission device 1110. The feedback information may include a result of decoding the data transmitted at the retransmission. For example, the feedback information may include information associated with the number of CBs of which decoding fails or the number of CBs of which decoding is successfully performed among CBs included in the data transmitted at retransmission.

Figure 13:
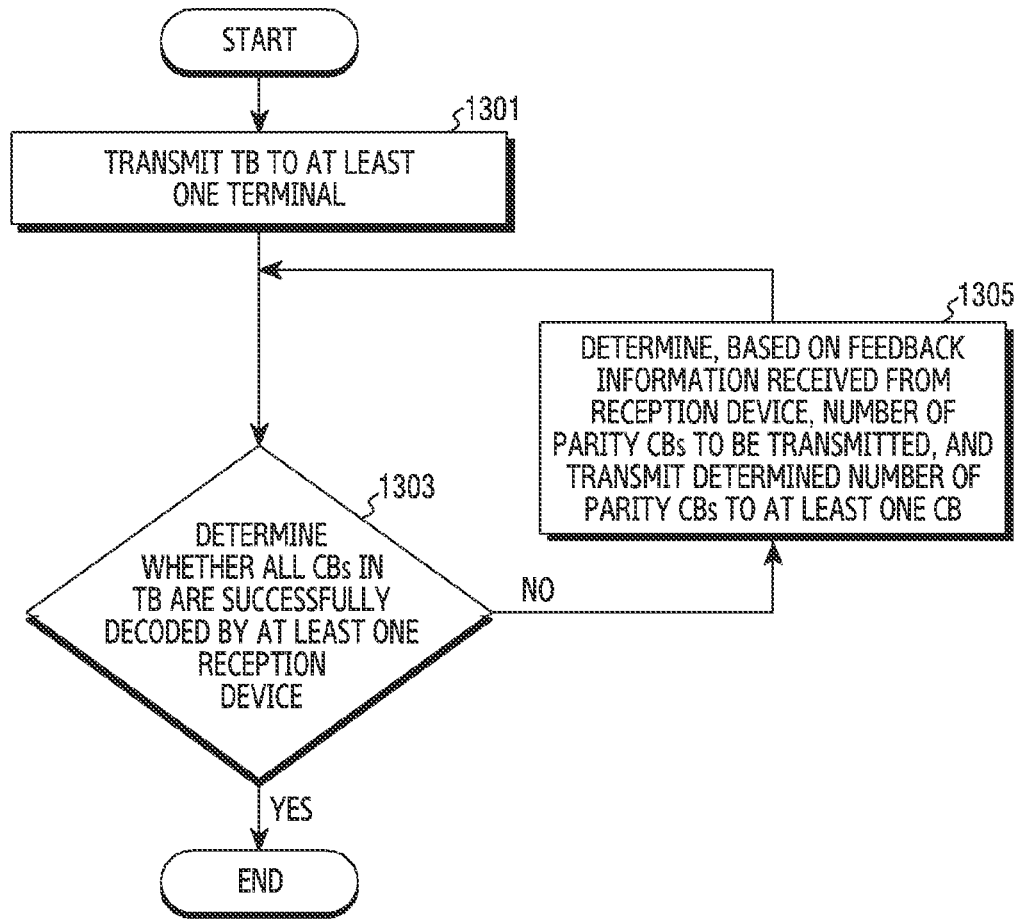
FIG. 13 is a flowchart illustrating operation by a transmission device when performing retransmission in a wireless communication system according to various embodiments.

FIG. 13 is a flowchart illustrating operation by a transmission device when performing retransmission in a wireless communication system according to various embodiments. FIG. 13 illustrates operation of the transmission device 1110.

Referring to FIG. 13, in operation 1301, the transmission device transmits a TB to at least one terminal. Transmission in operation 1301 may be initial transmission. If the transmission device is a terminal, the terminal may be configured or scheduled by a base station, so as to transmit data to another terminal, or may be a terminal that has authority to transmit data to another terminal within a group. At least one terminal that receives the TB may decode data based on control information, and may determine whether the CBs of the received TB are successfully decoded. Each of the at least one terminal may transmit, to the transmission device, feedback information (e.g., a HARQ-ACK feedback) including the number of CBs of which decoding fails or the number of CBs of which decoding is successfully performed.

In operation 1303, the transmission device may determine whether the all CBs in the TB are successfully decoded by the at least one reception device. For example, the transmission device may determine whether the all CBs included in the TB are successfully decoded by the at least one reception deice based on the feedback information received from the at least one reception device. If the all CBs in the TB are successfully decoded by the at least one reception device, the transmission device may terminate the algorithm.

If not all CBs in the TB are successfully decoded by the at least one reception device, the transmission device determines the number of parity CBs to be transmitted based on the feedback information received from the reception device, and may transmit the determined number of parity CBs to the at least one CB in operation 1305. The transmission device may obtain the parity CBs by applying an outer code to the CBs in the TB. For example, the transmission device may identify the maximum value among the numbers of CBs that respective reception devices fail to decode, based on the feedback information, and may transmit parity CBs of which the number corresponds to the identified maximum value, to the at least one reception device.

According to various embodiments of the disclosure, a transmission device transmits and/or retransmits data based on an outer code, and a reception device that receives the data may feed back, to the transmission device, the number of CBs of which decoding fails or the number of CBs of which decoding is successfully performed among the CBs included in the data. The feedback method may provide a performance gain effect that dramatically reduces the amount of feedback or the amount of retransmission data, unlike a legacy feedback method that feeds back information indicating a CB or a CBG of which decoding fails The performance gain effect according to various embodiments of the disclosure will be described in detail with reference to FIGS. 14A and 14B.

Figure 14A:
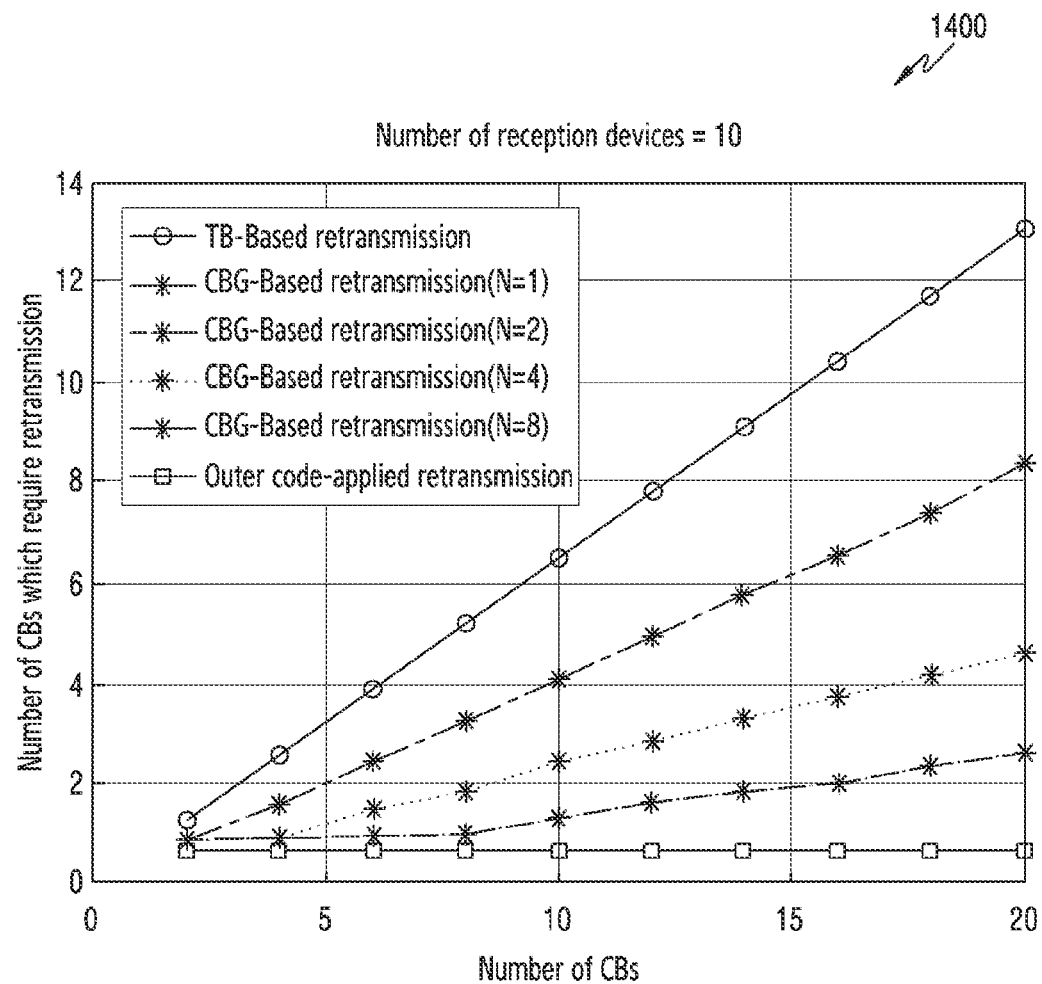
FIGS. 14A and 14B are graphs showing effects when an outer code is transmitted in a wireless communication system according to various embodiments of the disclosure.
Figure 14B:
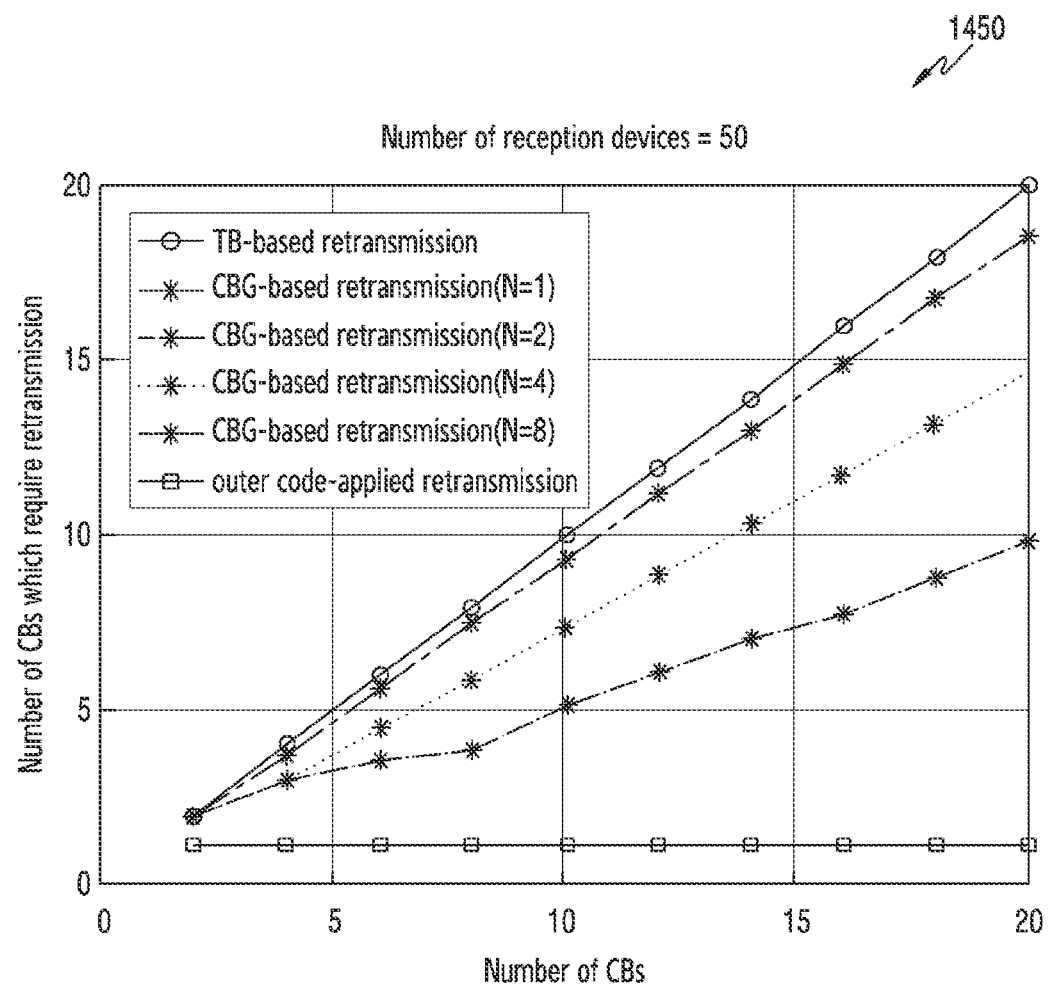

FIGS. 14A and 14B are graphs illustrating effects when an outer code is transmitted in a wireless communication system according to various embodiments of the disclosure.

A graph 1400 of FIG. 14A relates to the case in which a transmission device transmits data to ten reception devices. A graph 1450 of FIG. 14B relates to the case in which a transmission device transmits data to 50 reception devices. Each of the graph 1400 and the graph 1450 shows a relationship between the number of CBs included in a TB desired to be transmitted and the number of CBs which require retransmission. In the graphs 1400 and 1450, it is assumed that a target block error rate (BLER) of a TB desired to be transmitted is 10% and an error in decoding a CB randomly occurs.

Referring to FIGS. 14A and 14B, when compared to legacy TB-based retransmission or CBG-based retransmission, outer code-applied retransmission may dramatically reduce the number of CBs required to be retransmitted. In the graphs 1400 and 1450, N denotes the maximum number of CBGs per TB used in CBG-based retransmission. Therefore, N may be the number of bits that a reception device feeds back to a transmission device.

Embodiment 1-1

Embodiment 1-1 illustrates the case of producing parity CBs by applying an outer code to data CBs if the lengths of the data CBs are different from each other.

Figure 15A:
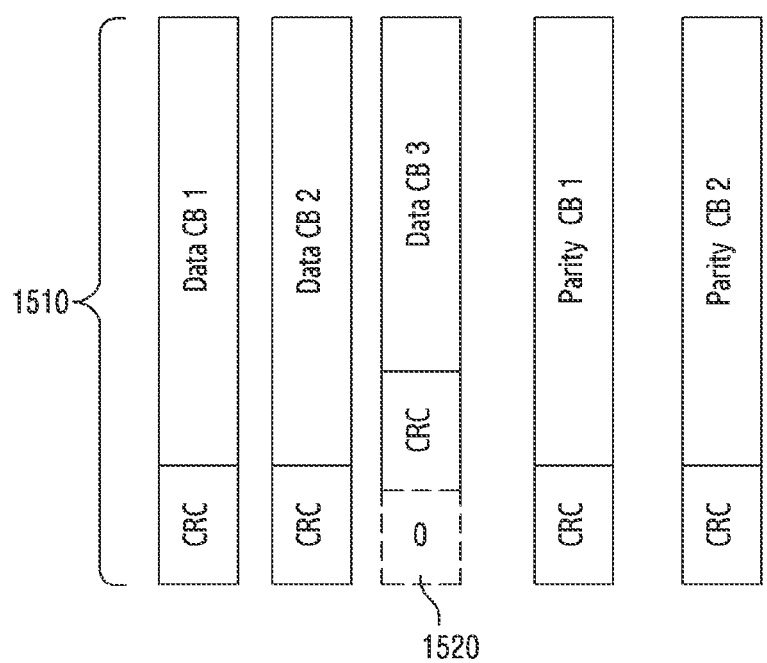
FIGS. 15A and 15B are diagrams illustrating examples of the case of applying an outer code to data CBs having different lengths in a wireless communication system according to various embodiments of the disclosure.
Figure 15B:
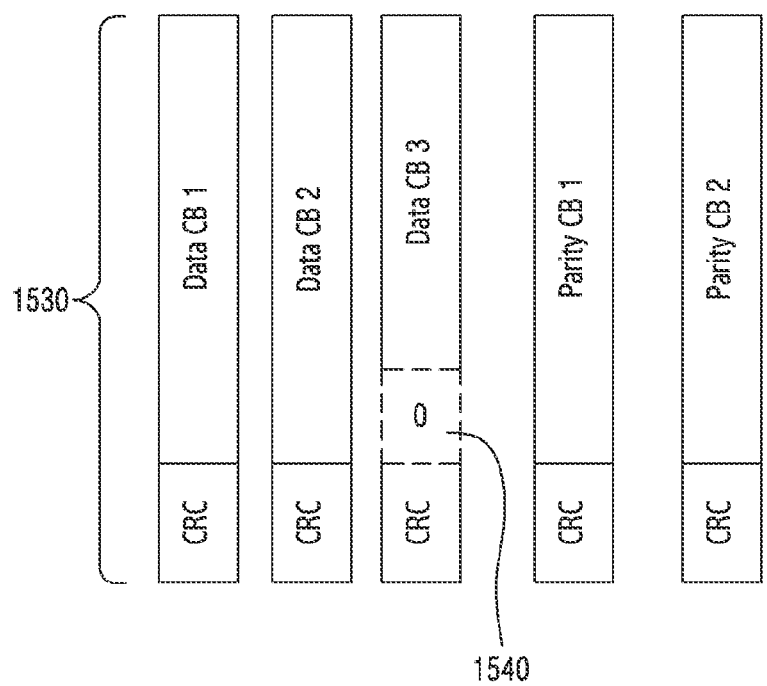

FIGS. 15A and 15B are diagrams illustrating examples of the case of applying an outer code to data CBs having different lengths in a wireless communication system according to various embodiments of the disclosure.

Referring to FIG. 15A, if data CBs include at least one data CB having a length different from one another, a transmission device may virtually add "0" or "NULL" 1520 to the end of a CRC-added-data CB, which is shorter than the maximum length 1510 of data CBs to which CRCs are added (hereinafter, CRC-added-data CB), in order to make the lengths of all the CRC-added-data CBs to be identical, and may produce parity CBs by applying an outer code to the CRC-added-data CB to which "NULL" 1520 is added and other CRC-added-data CBs. Here, in channel coding performed after the outer code, the transmission device may apply channel coding to data, excluding NULL 1520.

Referring to FIG. 15B, if data CBs includes at least one data CB having a length different from one another, a transmission device may add "0" or "NULL" 1540 to a data CB, which is shorter than the maximum length 1530 of the data CBs, so as to make the lengths of all CBs to be identical, may add a CRC to each CB, and may apply an outer code to a CRC-added data CB including "NULL" 1540 and other CRC-added data CBs so as to produce parity CBs. Here, in channel coding performed after the outer code, the transmission device may apply channel coding to data, excluding NULL 1540.

Embodiment 2

Embodiment 2 describes a method and apparatus that delivers information associated with CBs included data using some bits of DCI or SCI if a transmission device performs configuration for reception devices in association with use of an outer code.

According to various embodiments of the disclosure, in the case in which an outer code is configured, a bit field indicating information associated with CBs may be included in not all DCI or SCI formats. For example, if the use of an outer code is configured, a bit field indicating information associated with CBs may be included in DCI or SCI provided in a predetermined format. The length of the bit field may be configured via higher signaling, or may be a predetermined value. Alternatively, if an outer code is configured, the length of the bit field may be determined based on the maximum number of parity CBs capable of being transmitted at one time. For example, if the maximum number of parity CBs capable of being transmitted at one time is N (or if the maximum number of parity CBs is set to N), the length of the bit field may be expressed by $\lceil \log_2(N+1) \rceil$ or $\lceil \log_2(N) \rceil$. In the above expression, $\lceil X \rceil$ denotes the smallest integer among numbers greater than X. Alternatively, $\lceil X \rceil$ may be obtained by rounding up X to the nearest integer value. In addition, the maximum number (N) of parity CBs capable of being transmitted at one time may be configured for a reception device (e.g., a UE) via higher layer signaling (e.g., radio resource control (RRC) signaling) from a transmission device (e.g., a base station). In the disclosure, the bit field including the information related to an outer code in DCI or SCI may be referred to as outer code information (OCI) or parity code block information (PCI). According to various embodiments of the disclosure, if the length of an OCI bit field or the length of a PCI bit field is set to M, the number of parity CBs capable of being transmitted at one time may be determined based on M. For example, if the length of a bit field is M, the maximum number of parity CBs capable of being transmitted at one time may be $2^M-1$.

If the use of an outer code is configured, the value of a bit field included in DCI or SCI provided in a predetermined format may be information associated with a CB included in the corresponding data transmission. If all bits in the corresponding bit field are "0", all data CBs may be transmitted without transmission of a parity CB. If at least one of the bits of the corresponding bit field is "1", the bit value of the bit field may indicate that a data CB is not transmitted and indicate the number of parity CBs transmitted. For example, if an outer code is configured and the length of a bit field is set to 4 (in other words, the maximum number of parity CBs capable of being transmitted at one time is 15), the bit value of a bit field, "0000", may indicate that a parity CB is not transmitted and all data CBs are transmitted. In addition, a bit field value of "1000" indicates that a data CB is not transmitted and 8 parity CBs are transmitted.

Figure 16:
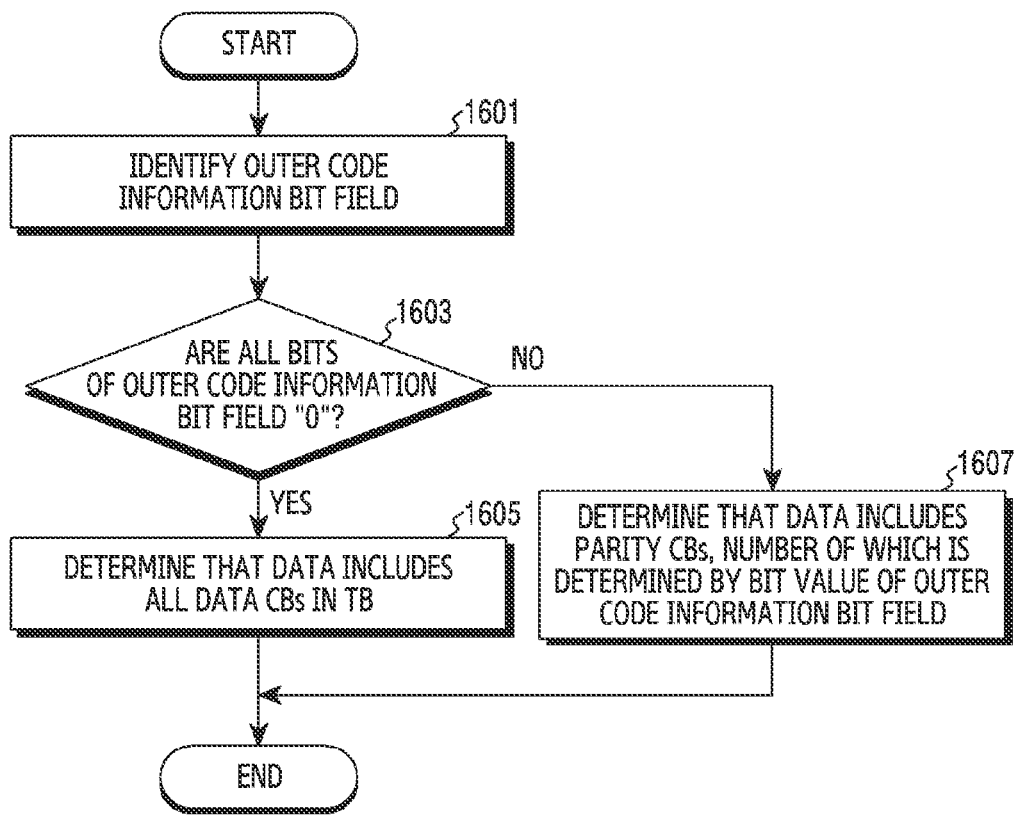
FIG. 16 is a flowchart illustrating operation by a reception device when receiving control information including an OCI bit field in a wireless communication system according to various embodiments of the disclosure.

FIG. 16 is a flowchart illustrating operation by a reception device when receiving control information including an OCI bit field in a wireless communication system according to various embodiments of the disclosure. FIG. 16 illustrates operation of the reception device 1121 (or 1123, 1125, or 1127).

Referring to FIG. 16, in operation 1601, the reception device identifies an OCI bit field. For example, the reception device may receive control information such as DCI or SCI from a transmission device, and may identify an OCI bit field from the control information.

In operation 1603, the reception device identifies whether all bits of the OCI bit field are "0". For example, if the length of the OCI bit field is set to 4, the reception device may identify whether the bit value of the OCI bit field is "0000".

If all the bits of the OCI bit field are "0", the reception device determines that data includes all data CBs of a TB in operation 1605.

If all the bits of the OCI bit field are not "0", the reception device may determine that data include parity CBs of which the number is indicated by the OCI bit field.

According to various embodiments of the disclosure, if a new data indicator (NDI) of DCI and/or SCI is the same as an NDI included in DCI or SCI received in advance in the same HARQ process, an MCS bit field may be interpreted to be OCI.

Embodiment 2-1

Embodiment 2-1 illustrates the case of transmitting information associated with a parity CB to be transmitted, using DCI or SCI. Information associated with a parity CB may be information associated with the location of a parity CB transmitted (i.e., the location where a transmitted parity CB starts) or the index thereof. In the disclosure, the information associated with the location of a parity CB may be referred to as a parity version (PV). In other words, a PV may include information indicating that what number parity CB is transmitted first.

For example, if a PV is expressed by 2 bits, the possible bit values of the PV (e.g., 00, 01, 10, and 11) may indicate one of the four predetermined locations. For example, if M parity CBs are present, a PV value may indicate parity CB $i \cdot \lfloor M/4 \rfloor$ or may indicate that transmission starts from parity CB $i \cdot \lfloor M/4 \rfloor$. Here, i denotes the bit value of a PV which is changed into a decimal number. The number of transmitted parity CBs may be indicated by OCI. For example, if a PV is expressed by 2 bits, the location (or the index) of a parity CB indicated by each PV value may be as shown in Table 2.

TABLE 2

| PV bit value | start parity CB index |
| --- | --- |
| 00 | 0 |
| 01 | $\lfloor M/4 \rfloor$ |
| 10 | $2 \cdot \lfloor M/4 \rfloor$ |
| 11 | $3 \cdot \lfloor M/4 \rfloor$ |

In Table 2, M may be a predetermined value, or may be configured via RRC signaling or broadcast information. As another example, M may be determined according to the type of outer code used.

According to various embodiments of the disclosure, the index of a parity CB indicated by a PV value may be determined based on the maximum value among the numbers of parity CBs indicated by OCI. For example, if the maximum value among the numbers of parity CBs indicated by OCI is P, the index of a start parity CB indicated by a PV value i, which is changed into a decimal number, may be determined to be i·P. For example, the maximum value among the numbers of parity CBs indicated by 4-bit OCI is 15, and thus, a PV value i, which changed into a decimal number, may indicate that transmission starts from a $15i^{th}$ parity CB.

Embodiment 2-2

Embodiment 2-2 illustrates an example of the case in which an RV field is interpreted based on the value of an OCI bit field.

Figure 17:
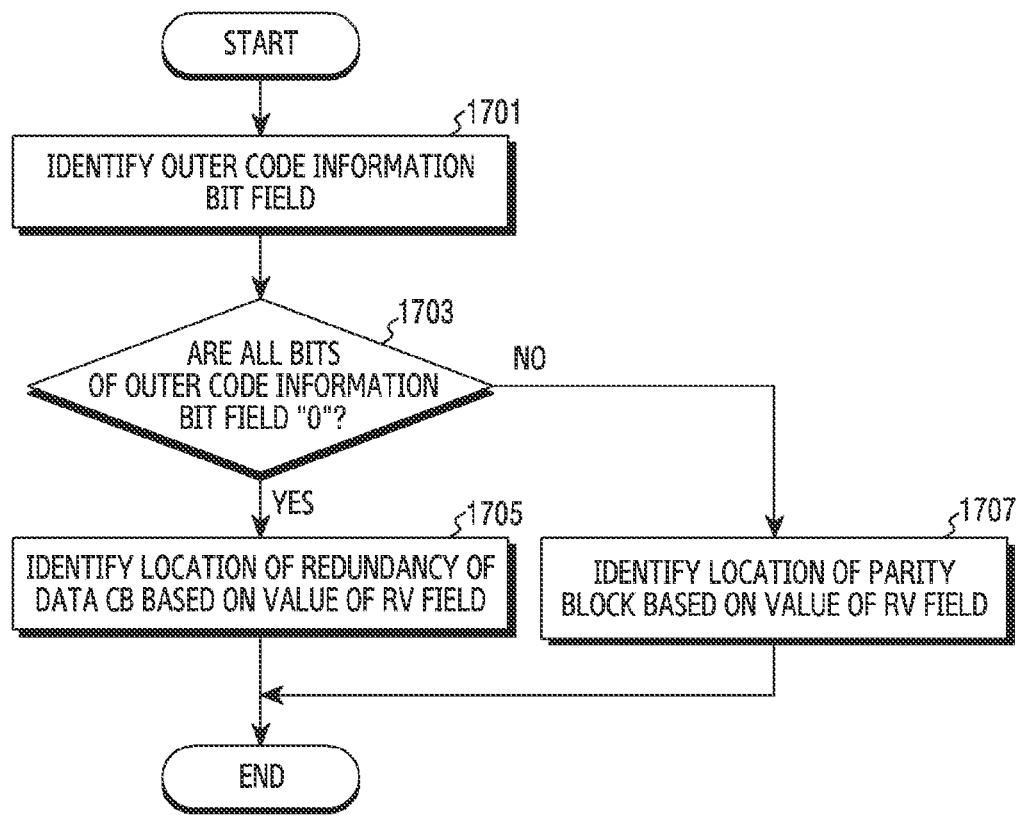
FIG. 17 is a flowchart illustrating operation by a reception device when interpreting an RV field based on the value of an OCI bit field in a wireless communication system according to various embodiments of the disclosure.

FIG. 17 is a flowchart illustrating operation by a reception device when interpreting an RV field based on the value of an OCI bit field in a wireless communication system according to various embodiments of the disclosure.

FIG. 17 illustrates operation of the reception device 1121 (or the reception device 1123, 1125, or 1127). Referring to FIG. 17, in operation 1701, the reception device identifies an OCI bit field. For example, the reception device may receive control information such as DCI or SCI from a transmission device, and may identify an OCI bit field from the control information.

In operation 1703, the reception device identifies whether all bits in the OCI bit field are "0". For example, if the length of the OCI bit field is set to 4, the reception device may identify whether the bit value of the OCI bit field is "0000".

If all the bits of the OCI bit field are "0", the reception device identifies the location of a redundancy associated with a data CB based on the value of an RV field in operation 1705. In other words, the reception device may interpret that the value of the RV field indicates the location (or the index) of a (start) redundancy associated with the data CB.

If all the bits of the OCI bit field are not "0", that is, the bits in the OCI bit field include at least one "1", the reception device may identify the location of a parity CB based on the value of the RV field in operation 1707. In other words, the reception device may interpret that the value of the RV field as a PV value that indicates the location (or the index) of a (start) parity CB.

Embodiment 2-3

Embodiment 2-3 illustrates the case of selectively applying a method of transmitting parity CBs at CBG-based retransmission and retransmission.

According to various embodiments of the disclosure, retransmission mode 1 and retransmission mode 2 may be defined. Retransmission mode 1 and retransmission mode 2 are as follows:

Retransmission mode 1: a mode for performing CBG-based retransmission. Control information may include a CBG transmission information (CBGTI) field indicating CBGs to be transmitted.

Retransmission mode 2: a mode for transmitting parity CBs by applying an outer code at retransmission. Control information may include an OCI bit field indicating the number of parity CBs to be transmitted.

A transmission device may configure one of retransmission mode 1 and retransmission mode 2 for a reception device. The transmission device may transmit data to the reception device based on one of retransmission mode 1 and retransmission mode 2. For example, DCI or SCI may include an one-bit indicator indicating retransmission mode 1 or retransmission mode 2. According to various embodiments of the disclosure, an indicator indicating a retransmission mode may be referred to as a retransmission scheme flag or a retransmission flag. For example, a retransmission flag of "0" may indicate retransmission mode 1, and a retransmission flag of "1" may indicate retransmission mode 2. Interpretation of the remaining bit fields of the control information may be changed depending on the value of the retransmission flag. For example, if the retransmission flag is "0" (i.e., retransmission mode 1), an RV field may indicate the location (or the index) of a (start) redundancy associated with a data CB. If the retransmission flag is "1" (i.e., retransmission mode 2), the RV field may be interpreted to be a PV value indicating the location (or the index) of a (start) parity CB.

As another example, retransmission mode 1 and retransmission mode 2 may be distinguished based on the value of an RNTI that masks a CRC which is added to control information. For example, the reception device may be configured with two RNTI values for data transmission, by the transmission device. Each RNTI value may indicate retransmission mode 1 or retransmission mode 2. The interpretation of the remaining bit fields of the control information may be changed depending on the value of an RNTI that masks a CRC added to the control information.

Embodiment 3

Embodiment 3 illustrates the case in which a reception device reports the number of data CBs of which decoding fails or the number of data CBs of which decoding is successfully performed, via feedback information (e.g., a HARQ-ACK feedback).

Embodiment 3 provides a method and apparatus for transmitting feedback information including information related to a result of decoding to a transmission device by a reception device, if the transmission device perform configuration for reception devices in association with the use of an outer code. According to various embodiments of the disclosure, in the case in which an outer code is configured, a bit field indicating information associated with CBs may be included in not all DCI or SCI formats. For example, if the use of an outer code is configured, a bit field indicating information associated with CBs may be included in DCI or SCI provided in a predetermined format. The length of the bit field may be configured via higher signaling, or may be a predetermined value. Alternatively, if an outer code is configured, the length of the bit field may be determined based on the maximum number of parity CBs capable of being transmitted at one time. For example, if the maximum number of parity CBs capable of being transmitted at one time is N, the length of a bit field may be expressed as $\lceil \log_2(N+1) \rceil$. In the disclosure, the bit field including the information related to an outer code in the DCI or SCI may be referred to as outer code information (OCI) or parity code block information (PCI).

If the use of an outer code is configured, feedback information may include information (e.g., a HARQ-ACK feedback bit) associated with the number of data CBs of which decoding fails among data CBs included in a TB desired to be transmitted. If all bits of a HARQ-ACK feedback are "0", the HARQ-ACK feedback may indicate that all data CBs are successfully decoded. Conversely, if at least one bit in the bit field of the HARQ-ACK feedback is "1", the bit field of the HARQ-ACK feedback may indicate that the number of data CBs of which decoding fails corresponds to a decimal number value of the bit field. If all bits in the bit field of the HARQ-ACK feedback are "1", the bit field of the HARQ-ACK feedback may indicate that the number of data CBs of which decoding fails is a decimal number value or higher.

For example, if an outer code is configured, the length of a bit field is 4, and the number of data CBs included in a TB transmitted according to scheduling information is N, a bit value of "0000" of the HARQ-ACK feedback may indicate that N data CBs are successfully decoded, and a bit value of "1111" of the HARQ-ACK feedback may indicate that decoding of 15 or more data CBs fails. Bit values of the HARQ-ACK feedback, other than "0000" and "1111", may indicate the number of data CBs of which decoding fails. According to various embodiments of the disclosure, if decoding of 15 or more data CBs fails, the reception device transmits a HARQ-ACK feedback, of which bits are all "1", to the transmission device. Otherwise, the reception device changes the number of data CBs of which decoding fails into a binary number and determines the result to be the bit value of the HARQ-ACK feedback.

In the above-described embodiments, although it is described that the bit field of a HARQ-ACK feedback indicates the number of data CBs of which decoding fails, this is merely an example. The bit field of the HARQ-ACK feedback may indicate the number of data CBs of which decoding is successfully performed.

Embodiment 3-1

Embodiment 3-1 illustrates a method of determining the bit value of a HARQ-ACK feedback when two TBs or two codeword (CWs) are transmitted via a PDSCH or a PSSCH. In various embodiments of the disclosure, a TB and a CW may be interchangeably used.

In the state in which a first TB and a second TB are transmitted, if the number of CBs of which decoding fails among data CBs included in a first TB is X1 and the number of CBs of which decoding fails among data CBs included in a second TB is X2, the value of the HARQ-ACK bit field may be defined to be Y=MAX(X1, X2). Here, max(X1, X2) may indicate the maximum value between X1 and X2. In other words, a reception device may feed back the maximum value among the numbers of CBs of which decoding fails for respective TBs, based on the results of decoding the scheduled TBs, and may determine the maximum value to be the value of the HARQ-ACK bit field. For example, if the use of an outer code is configured, the length of the HARQ-ACK feedback is 4 bits, and Y is "0" (i.e., if all data CBs in the first TB and the second TB are successfully decoded), the reception device may determine the bit value of the HARQ-ACK feedback to be "0000". As another example, if Y is 15 or higher, the reception device may determine the bit value of the HARQ-ACK feedback to be "1111". If Y is greater than 0 and less than 15, the reception device may change Y into a binary number, and may determine the value to be the bit value of the HARQ-ACK feedback.

In the above-described embodiments, although it is described that the bit value of the HARQ-ACK bit field indicates information associated with data CBs of which decoding fails, this is merely an example. Various embodiments of the disclosure may be applicable to the case in which the bit value of the HARQ-ACK bit field indicates information associated with data CBs of which decoding successes. For example, if the number of data CBs of which decoding is successfully performed among data CBs of the first TB is Z1 and the number of data CBs of which decoding is successfully performed among data CBs of the second TB is Z2, the reception device may determine the bit value W of the HARQ-ACK feedback to be Y=min(Z1, Z2). In the equation, min(Z1, Z2) denotes the minimum value between Z1 and Z2. In other words, the reception device may feed back the minimum value among the numbers of CBs of which decoding is successfully performed for respective TBs, based on the results of decoding the scheduled TBs, and may determine the minimum value to be the value of the HARQ-ACK bit field.

Embodiment 3-2

Embodiment 3-2 illustrates a method for transmitting a HARQ-ACK feedback for CBG-based retransmission and a HARQ-ACK feedback including information associated with the number of CBs of which decoding fails.

According to various embodiments of the disclosure, feedback mode 1 and feedback mode 2 may be defined. Feedback mode 1 and feedback mode 2 are as follows:

Feedback mode 1: a mode for performing HARQ-ACK feedback for CBG-based retransmission. In feedback mode 1, a HARQ-ACK feedback may indicate the success or failure associated with decoding of a CBG, using one bit for each CBG.

Feedback mode 2: a mode for transmitting a HARQ-ACK feedback indicating the number of data CBs of which decoding fails.

A transmission device may configure one of feedback mode 1 and feedback mode 2 for a reception device. For example, the transmission device may indicate, for the reception device, one of feedback mode 1 and feedback mode 2 via RRC configuration, system broadcast information, or the bit value of DCI or SCI (e.g., a bit value expressed by one bit).

As another example, feedback mode 1 and feedback mode 2 may be distinguished based on the value of an RNTI that masks a CRC which is added to control information. For example, the reception device may be configured with two RNTI values for data transmission, by the transmission device. Each RNTI value may indicate feedback mode 1 or feedback mode 2.

Embodiment 4

Embodiment 4 illustrates the case of transmitting a data CB and a parity CB at retransmission. Unlike the above-described embodiments that retransmit data CBs or parity CBs depending on the bit value of control information, embodiment 4 provides a method of transmitting data CBs and parity CBs at retransmission (or initial transmission).

Figure 18A:
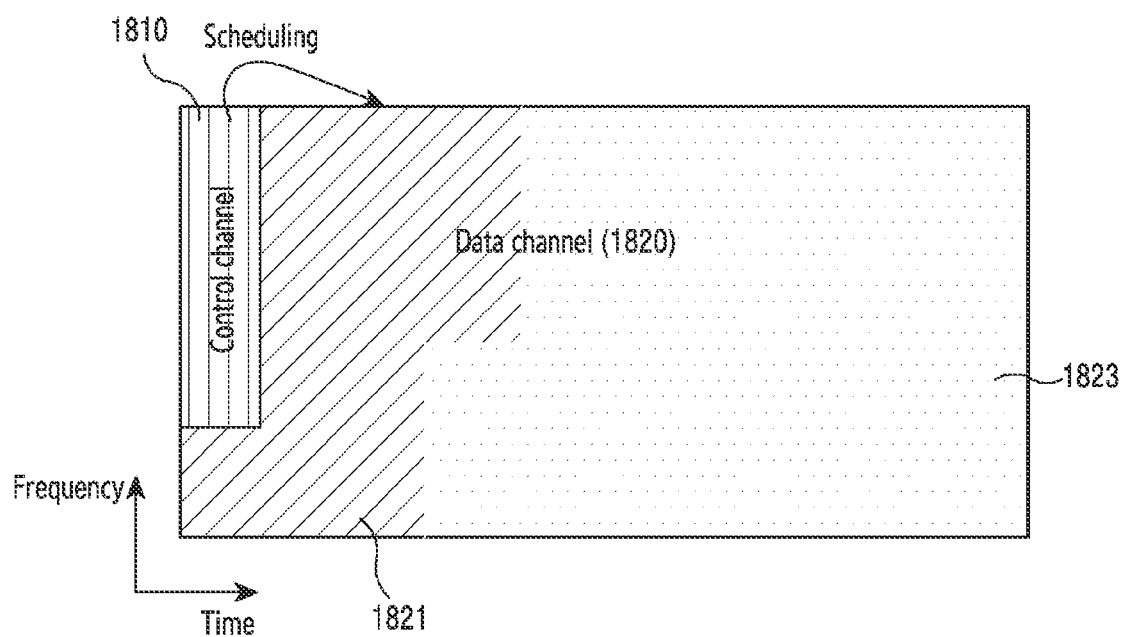
FIGS. 18A to 18C are diagrams illustrating mapping of data CBs and parity CBs in a resource region in a wireless communication system according to various embodiments of the disclosure.
Figure 18B:
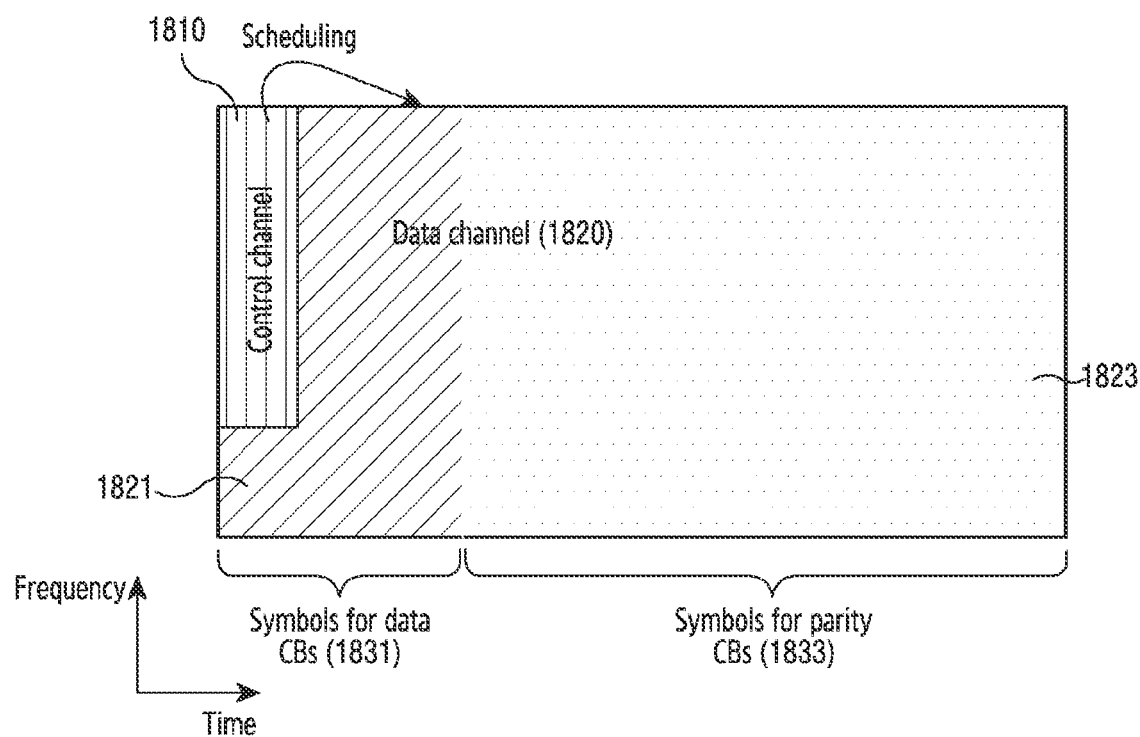
Figure 18C:
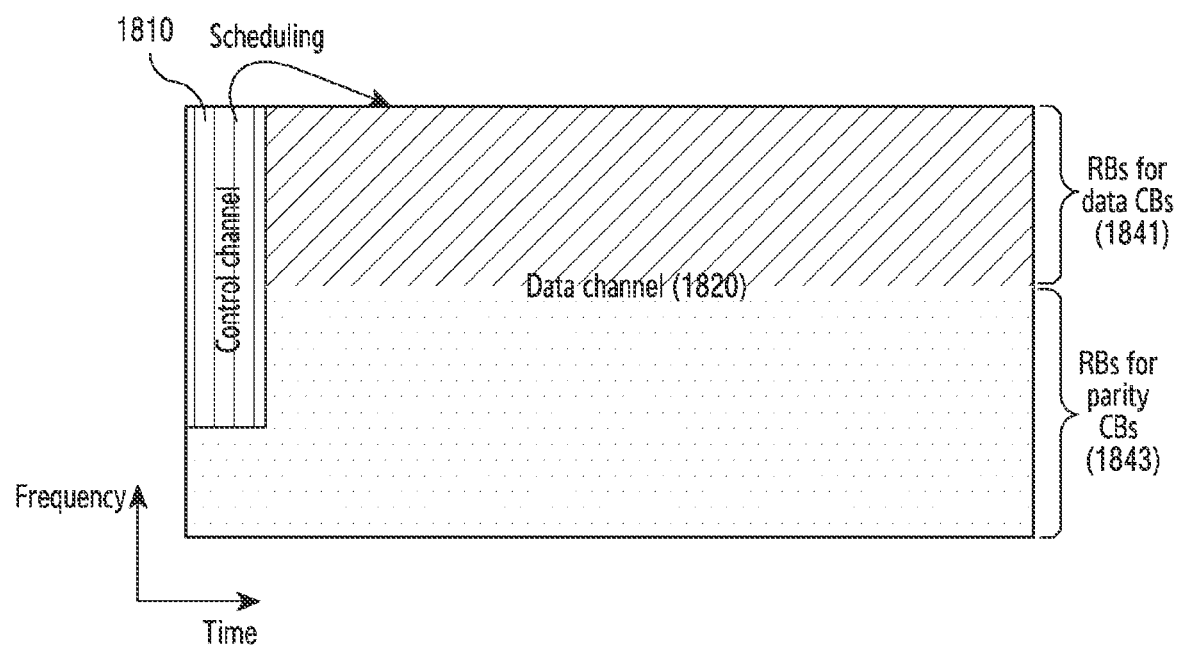

FIGS. 18A to 18C are diagrams illustrating mapping of data CBs and parity CBs in a resource region in a wireless communication system according to various embodiments of the disclosure.

FIG. 18A illustrates the case of mapping, onto predetermined data, bits related to all data CBs 1821 of previously transmitted data and parity CBs 1823 produced by applying an outer code, and transmitting the same, in the case in which scheduling information associated with a data channel 1820 is transmitted in a control channel 1810. The frequency and time domain resources for mapping associated with the data channel 1820 may be included in control information transmitted via the control channel 1810. Information associated with the amount of resources onto which the data CBs 1821 are to be mapped and the amount of resources onto which the parity CBs 1823 are to be mapped in the entire resource region may be indicated by some bits of the control information transmitted via the control channel 1810, may be configured in advance via RRC signaling, or may be a predetermined value. For example, it is configured that a % of the number of REs included in the entire resource region of the data channel 1820 is used for mapping of the data CBs 1821 and the remaining 100-a % of the number of REs is used for mapping of the parity CBs 1823. Information associated with "a" may be indicated by some bits of the control information transmitted via the control channel 1810, may be configured in advance via RRC signaling, or may be a value determined in advance. For example, if the number of REs included in the entire resource region of the data channel 1820 is X, data CBs 1821 may be mapped to REs, the number of which corresponds to ceiling(aX/100) or floor(aX/100), and parity CBs 1823 may be mapped to REs, the number of which corresponds to the remaining X-ceiling (aX/100) or X-floor(aX/100). Here, ceiling(X) is the smallest integer which is greater than X, and floor(X) is the largest integer which is smaller than X. For example, "a" may be indicated by a separate bit field of the control information, or may be indicated by some bits of the bit field used as MCS at the initial transmission in the control information.

FIG. 18B illustrates the case of mapping the data CBs 1821 onto some symbols and mapping the parity CBs 1823 onto the remaining symbols in the entire frequency-time resources scheduled for the data channel 1820, For example, if the total number of symbols allocated for the data channel 1820 is X, the data CBs 1821 may be mapped onto symbols 1831, the number of which corresponds to ceiling(aX/100) or floor(aX/100), and the parity CBs 1823 may be mapped onto symbols 1833, the number of which corresponds to the remaining X-ceiling(aX/100) or X-floor(aX/100).

FIG. 18C illustrates the case of mapping the data CBs 1821 onto some RBs and mapping the parity CBs 1823 onto the remaining RBs in the entire frequency-time resources scheduled for the data channel 1820. For example, if the total number of RBs allocated for the data channel 1820 is X, the data CBs 1821 may be mapped onto RBs 1841, the number of which corresponds to ceiling(aX/100) or floor (aX/100), and the parity CBs 1823 may be mapped onto RBs 1843, the number of which corresponds to the remaining X-ceiling(aX/100) or X-floor(aX/100).

Embodiment 5

Embodiment 5 illustrates a flow of signals exchanged between a transmission device and a reception device for data retransmission according to various embodiments of the disclosure.

Figure 19:
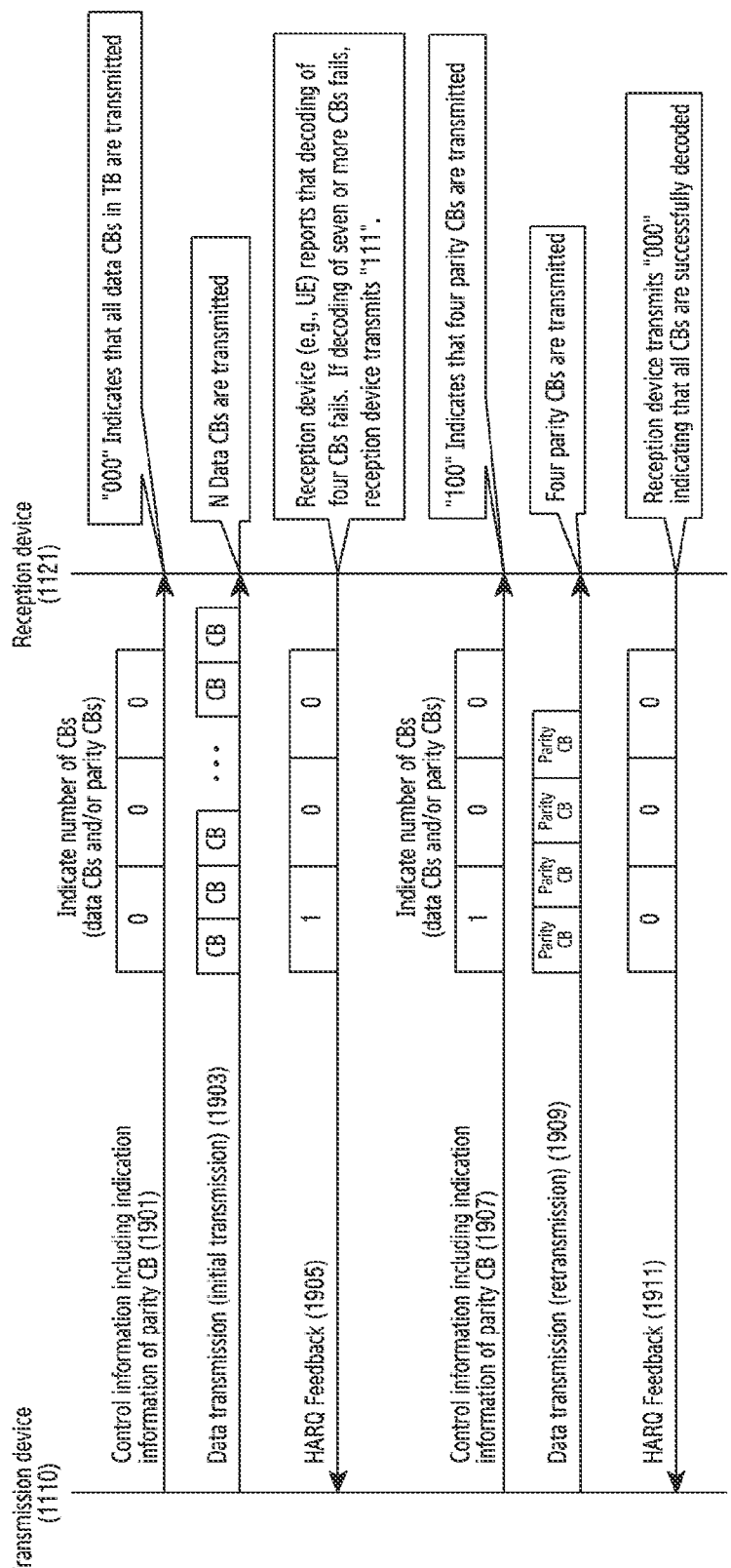
FIG. 19 is a signal flow between a transmission device and a reception device in a wireless communication system according to various embodiments.

FIG. 19 is a signal flow between a transmission device and a reception device in a wireless communication system according to various embodiments. FIG. 19 illustrates a signal flow between the transmission device 1110 and the reception device 1121 (or the reception device 1123, 1125, or 1127). The transmission device 1110 may be a base station or a terminal, and the reception device 1121 may be a base station or a terminal.

Referring FIG. 19, in operation 1901, the transmission device 1110 transmits control information including indication information associated with a parity CB to the reception device 1121. In other words, the transmission device 1110 may transmit OCI to the reception device 1121. At initial transmission, OCI may indicate that data (or a TB) to be transmitted includes data CBs and does not include parity CBs. To this end, all bits of an OCI bit field may be set to "0". For example, if the length of the OCI bit field is 3, "000" may indicate that all data CBs of a TB are transmitted.

In operation 1903, the transmission device 1110 may transmit data to the reception device 1121 at the initial transmission. The transmission device 1110 may transmit the data according to the OCI transmitted in operation 1901.

For example, since the transmission device 1110 transmits the OCI of which all bits are "0" to the reception device 1121 at the initial transmission, the transmission device 1110 may transmit data including all data CBs (e.g., N data CBs) to the reception device 1121 according to the OCI.

In operation 1905, the reception device 1121 transmits feedback information (e.g., a HARQ-ACK feedback) to the transmission device 1110. The reception device 1121 may decode the data CBs received at the initial transmission, and may identify the number of data CBs of which decoding fails. The reception device 1121 may transmit feedback information including information indicating the number of data CBs of which decoding fails to the transmission device 1110. For example, the length of a feedback information bit field may be set to 3 bits. In this instance, if decoding of four CBs fails, the reception device 1121 may feedback a bit value of "100". As another example, if decoding of seven or more CBs fails, the reception device 1121 may feedback a bit value of "111".

In operation 1907, the transmission device 1110 may transmit control information including indication information associated with a parity CB to the reception device 1121. In other words, the transmission device 1110 may transmit OCI to the reception device 1121. At retransmission, the OCI may indicate the number of parity CBs to be transmitted. For example, if the transmission device 1110 desires to transmit four parity CBs at retransmission, the bit value of the OCI bit field may be "111".

In operation 1909, the transmission device 1110 may transmit data to the reception device 1121 at retransmission. The transmission device 1110 may transmit data according to the OCI transmitted in operation 1907. For example, since the transmission device 1110 transmits the OCI of which the bit value is "100" to the reception device 1121 at the retransmission, the transmission device 1110 may transmit data including four parity CBs to the reception device 1121 according to the OC.

In operation 1911, the reception device 1121 transmits feedback information (e.g., a HARQ-ACK feedback) to the transmission device 1110. The reception device 1121 may re-decode data CBs, of which decoding fails at the initial transmission, based on the parity CBs received at the retransmission. If re-decoding is successfully performed, the reception device 1121 may transmit feedback information of which all bits are "0" to the transmission device 1110 in order to report that all data CBs are successfully decoded. For example, if the length of the feedback information bit field is set to 3 bits, the reception device 1121 may transmit feedback information of "000" to the transmission device 1110. Conversely, if data CBs of which re-decoding fails are present, the reception device 1121 may transmit feedback information including information indicating the number of data CBs of which re-decoding fails to the transmission device 1110.

Figure 20:
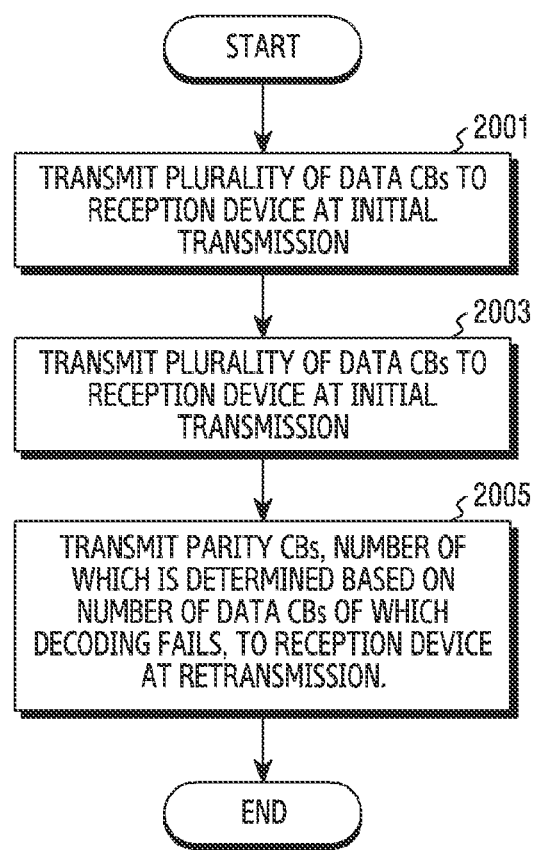
FIG. 20 is a flowchart illustrating operation of a transmission device in a wireless communication system according to various embodiments of the disclosure.

FIG. 20 is a flowchart illustrating operation of a transmission device in a wireless communication system according to various embodiments of the disclosure. FIG. 20 illustrates operation of the transmission device 1110.

Referring to FIG. 20, in operation 2001, the transmission device transmits a plurality of data code blocks (CBs) to at least one reception device at initial transmission. For example, the transmission device may add a CRC to a TB, may divide TBs to which CRCs are added into a plurality of CBs, may add a CRC to each of the plurality of CBs, and may transmit the plurality of CBs to which CRCs are added to the at least one reception device. According to various embodiments of the disclosure, a CRC may be omitted from at least one of a TB and a CB.

In operation 2003, the transmission device may receive, from the at least one reception device, feedback information including information indicating the number of data CBs of which decoding fails among the plurality of data CBs. If the at least one reception device includes a plurality of reception devices, the transmission device may receive, from each of the plurality of reception devices, feedback information including information indicating the number of data CBs that the corresponding reception device fails to decode.

In operation 2005, the transmission device may transmit parity CBs, the number of which is determined based on the number of data CBs of which decoding fails, to the at least one reception device at retransmission. The transmission device may produce the parity CBs by applying an outer code to the data CBs. The outer code may include at least one of a Reed-Solomon code, a BCH code, a raptor code, and a parity bit generation code.

The above-described embodiment 1 to embodiment 5 may be applicable to the method of operating the transmission device illustrated in FIG. 20. For example, the number of the parity CBs produced by the transmission device may be the maximum value among the numbers of data CBs that the plurality of reception devices fail to decode, respectively. As another example, the transmission device may transmit control information (e.g., OCI) indicating at least one of the number of parity CBs to be transmitted or the types of parity CBs to be transmitted, to the at least one reception device. Here, the length L of the bit field of the control information may be determined to be $L=\lceil \log_2(N+1) \rceil$, and N may be the maximum number of parity CBs capable of being transmitted at one time. If the value of the bit field of the control information is a predetermined value, the bit field may indicate that a plurality of data CBs are transmitted without transmission of parity CBs at initial transmission. If the value of the bit field of the control information is not a predetermined value, the bit field may indicate the number of parity CBs transmitted at retransmission. As another example, the transmission device may transmit data CBs and parity CBs together. In this instance, the transmission device may transmit control information indicating at least one of the location and the amount of resources to which data CBs are allocated and resources to which parity CBs are allocated to the at least one reception device.

Figure 21:
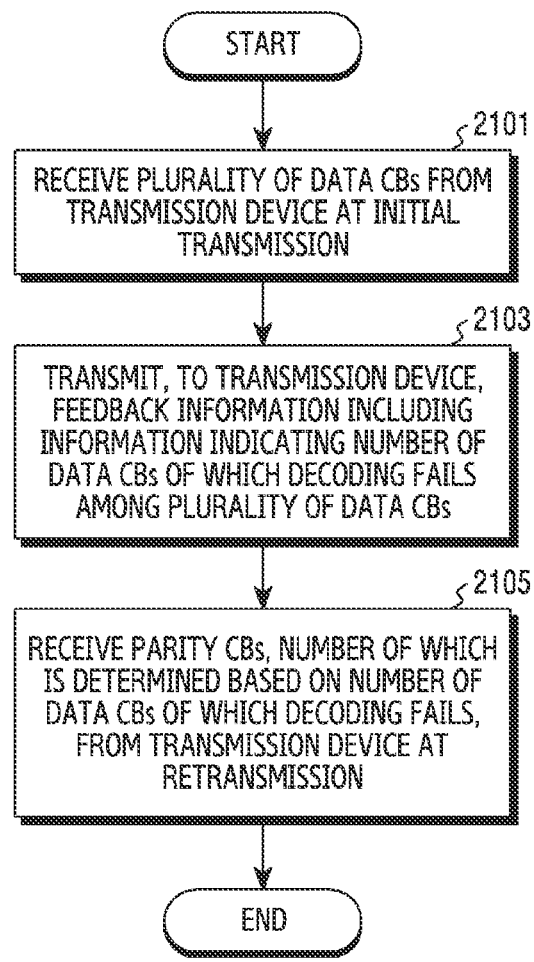
FIG. 21 is a flowchart illustrating operation of a reception device in a wireless communication system according to various embodiments of the disclosure.

FIG. 21 is a flowchart illustrating operation of a reception device in a wireless communication system according to various embodiments of the disclosure. FIG. 21 illustrates an operation method of the reception device 1121 (or the reception device 1123, 1125, or 1127).

Referring to FIG. 21, in operation 2101, the reception device may receive a plurality of data CBs from a transmission device at initial transmission. The reception device may receive a plurality of data CBs included in a single TB, or may receive data CBs included in a plurality of TBs.

In operation 2103, the reception device may transmit feedback information including information indicating the number of data CBs of which decoding fails among the plurality of data CBs to the transmission device. The reception device may decode the plurality of data CBs, and may identify data CBs of which decoding fails among the plurality of data CBs.

In operation 2105, the reception device may receive parity CBs, the number of which is determined based on the number of data CBs of which decoding fails, from the transmission device at retransmission. The reception device may re-decode the data CBs, of which decoding fails at the initial transmission, based on the parity CBs received at the retransmission.

The above-described embodiment 1 to embodiment 5 may be applicable to the operation method of the reception device illustrated in FIG. 21. For example, the reception device may transmit, to the transmission device, feedback information indicating the maximum value between the number of data CBs of which decoding fails among data CBs in one TB received, and the number of data CBs of which decoding fails among data CBs in the other TB. As another example, the reception device may receive, from the transmission device, control information (e.g., OCI) indicating at least one of the number of parity CBs to be transmitted or the types of parity CBs to be transmitted. Here, the length L of the bit field of the control information may be determined to be $L=\lceil \log_2(N+1) \rceil$, and N may be the maximum number of parity CBs capable of being transmitted at one time. If the value of the bit field of the control information is a predetermined value, the bit field may indicate that a plurality of data CBs are transmitted without transmission of parity CBs at initial transmission. If the value of the bit field of the control information is not a predetermined value, the bit field may indicate the number of parity CBs transmitted at retransmission. As another example, the reception device may receive data CBs and parity CBs together. In this instance, the reception device may receive information indicating at least one of the location and the amount of resources to which data CBs are allocated and resources to which parity CBs are allocated from the transmission device.

According to various embodiments, the reception device may receive a plurality of data CBs and other data CBs from the transmission device at initial transmission. In this instance, feedback information may include information indicating the maximum value between the number of data CBs of which decoding fails among the plurality of data CBs, and the number of data CBs of which decoding fails among the other data CBs.

Figure 22:
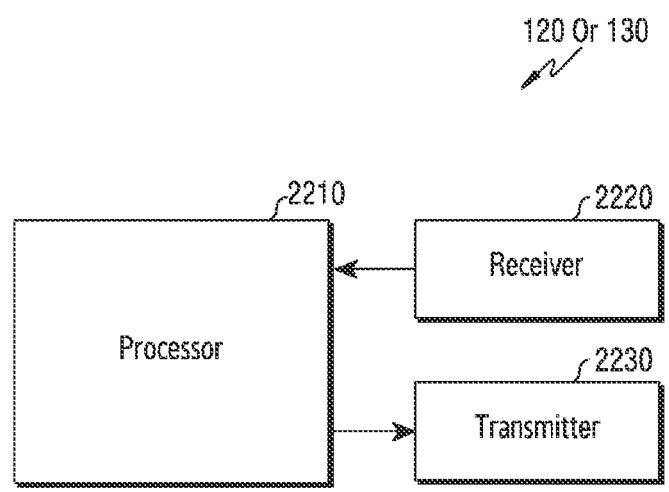
FIG. 22 is a diagram illustrating the configuration of a reception device in a wireless communication system according to various embodiments.

FIG. 22 is a block diagram illustrating the configuration of a reception device in a wireless communication system according to various embodiments. The configuration of FIG. 22 may be understood as the configuration of any one of the reception device 1121 (or 1123, 1125, or 1127), the base station 110, or the terminal 120.

Referring to FIG. 22, the reception device may include a processor 2210, a receiver 2220, and a transmitter 2230.

According to various embodiments of the disclosure, the receiver 2220 and the transmitter 2230 together may be referred to as a transceiver. The transceiver may perform transmission or reception of a signal with a transmission device. The signal that is transmitted or received may include control information and data. To this end, the transceiver may include an RF transmitter that up-converts and amplifies the frequency of a transmitted signal, and an RF receiver that low-noise amplifies a received signal and down-converts the frequency thereof. In addition, the transceiver may receive a signal received via a wireless channel and may output the same to the processor 2210, and may transmit a signal output from the processor 2210 via a wireless channel. The processor 2210 may control a series of processes such that a terminal operates according to the above-described embodiments of the disclosure. For example, the processor 2210 may control the receiver 2220 so as to receive scheduling information and control information from the transmission device, may determine a data reception, decoding, and feedback transmission method based on the control information, and may perform processing for transmitting feedback information. Subsequently, the transmitter 2230 may transmit the feedback information to the transmission device.

According to various embodiments, a reception device in a wireless communication system may include a transceiver, which is configured to receive, from a transmission device, a plurality of data code blocks (CBs) at initial transmission, to transmit, to the transmission device, feedback information including information indicating the number of data CBs of which decoding fails among the plurality of data CBs, and to receive parity CBs of which a number is determined based on the number of data CBs of which decoding fails, from the transmitting device at retransmission.

According to various embodiments, the parity CBs are produced by applying an outer code to the data CBs, and the outer code may include at least one of a Reed-Solomon code, a BCH (Bose, Chaudhuri, Hocquenghem) code, a raptor code, and a parity bit generation code.

According to various embodiments, the transceiver may be configured to receive other data CBs from the transmission device at the initial transmission, and the feedback information may include information indicating the maximum value between the number of data CBs of which decoding fails among the plurality of data CBs, and the number of data CBs of which decoding fails among the other data CBs.

According to various embodiments, the transceiver may be configured to receive, from the transmission device, control information indicating at least one of the number of CBs to be transmitted and types of CBs to be transmitted.

According to various embodiments, the length of the bit field of the control information is determined to satisfy $L=\lceil \log_2(N+1) \rceil$. Here, L denotes the length of the bit field of the control information, and N denotes the maximum number of parity CBs capable of being transmitted at one time.

According to various embodiments, if the value of the bit field of the control information is a predetermined value, the bit field indicates that the plurality of data CBs are transmitted without transmission of parity CBs at the initial transmission. If the value of the bit field of the control information is not the predetermined value, the bit field indicates the number of parity CBs transmitted at the retransmission.

According to various embodiments, the transceiver may be configured to receive, from the transmission device, other data CBs at the retransmission, and to receive, from the transmission device, control information indicating at least one of the location and the amount of resources to which the other data CBs are allocated and resources to which the parity CBs are allocated.

Figure 23:
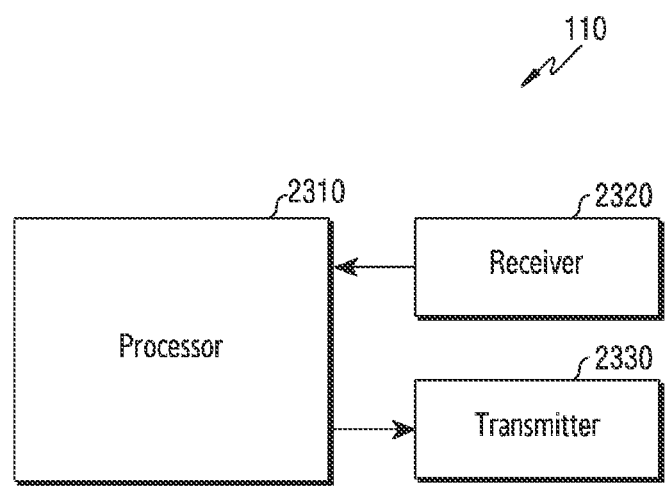
FIG. 23 is a diagram illustrating the configuration of a transmission device in a wireless communication system according to various embodiments of the disclosure.

FIG. 23 is a block diagram illustrating the configuration of a transmission device in a wireless communication system according to various embodiments of the disclosure. The configuration illustrated in FIG. 23 may be understood as the configuration of any one of the transmission device 1110, the base station 110, and the terminal 120.

Referring to FIG. 23, the transmission device may include a processor 2310, a receiver 2320, and a transmitter 2330.

According to various embodiments of the disclosure, the receiver 2320 and the transmitter 2330 together may be referred to as a transceiver. The transceiver may perform transmission or reception of a signal with a reception device. The signal transmitted or received may include control information and data. To this end, the transceiver may include an RF transmitter that up-converts and amplifies the frequency of a transmitted signal, and an RF receiver that low-noise amplifies a received signal and down-converts the frequency thereof. In addition, the transceiver may receive a signal via a wireless channel and output the same to the processor 2310, and may transmit a signal output from the processor 2310 via a wireless channel. The processor 2310 may control a series of processes such that the transmission device operates according to the above-described embodiments of the disclosure. For example, the processor 2310 may perform control so as to perform configuration related to use of an outer code. Subsequently, the transmitter 2330 may transmit scheduling information and control information, and the receiver 2320 may receive data or feedback from the reception device according to the scheduling information.

According to various embodiments of the disclosure, a transmission device in a wireless communication system may include a transceiver, which is configured to transmit a plurality of data code blocks (CBs) to at least one reception device at initial transmission, to receive feedback information including information indicating the number of data CBs of which decoding fails among the plurality of data CBs, from the at least one reception device, and to transmit parity CBs of which the number is determined based on the number of data CBs of which decoding fails, to the at least one reception device at retransmission.

According to various embodiments, at least one processor which produces parity CBs by applying an outer code to the data CBs may be further included. The outer code may include at least one of a Reed-Solomon code, a BCH (Bose, Chaudhuri, Hocque-nghem) code, a raptor code, and a parity bit generation code.

According to various embodiments, the at least one reception device may include a plurality of reception devices. The number of parity CBs may be the maximum value among the numbers of data CBs that the plurality of reception devices fails to decode, respectively.

According to various embodiments, the transceiver may be configured to transmit control information indicating at least one of the number of CBs and types of CBs to the at least one reception device.

According to various embodiments, the length L of the bit field of the control information is determined to satisfy $L=\lceil \log_2(N+1) \rceil$. Here, L denotes the length of the bit field of the control information, and N denotes the maximum number of parity CBs capable of being transmitted at one time.

According to various embodiments, if the value of the bit field of the control information is a predetermined value, the bit field may indicate that a plurality of data CBs are transmitted without transmission of parity CBs at initial transmission. If the value of the bit field of the control information is not a predetermined value, the bit field may indicate the number of parity CBs transmitted at retransmission.

According to various embodiments, the transceiver may be configured to transmit other data CBs at the retransmission, and to transmit control information indicating at least one of the location and the amount of resources to which the other data CBs are allocated and resources to which parity CBs are allocated.

The above-described various embodiments of the disclosure may be combined as needed. For example, a combination of embodiment 1 and embodiment 3 may be applicable. In addition, other modifications of the various embodiments of the disclosure, which are based on an LTE system and a 5G system, may be applicable.

Methods disclosed in the claims and/or methods according to various embodiments described in the specification of the disclosure may be implemented by hardware, software, or a combination of hardware and software.

When the methods are implemented by software, a computer-readable storage medium for storing one or more programs (software modules) may be provided. The one or more programs stored in the computer-readable storage medium may be configured for execution by one or more processors within the electronic device. The at least one program may include instructions that cause the electronic device to perform the methods according to various embodiments of the disclosure as defined by the appended claims and/or disclosed herein.

The programs (software modules or software) may be stored in non-volatile memories including a random access memory and a flash memory, a read only memory (ROM), an electrically erasable programmable read only memory (EEPROM), a magnetic disc storage device, a compact disc-ROM (CD-ROM), digital versatile discs (DVDs), or other type optical storage devices, or a magnetic cassette. Alternatively, any combination of some or all of them may form a memory in which the program is stored. Further, a plurality of such memories may be included in the electronic device.

In addition, the programs may be stored in an attachable storage device which may access the electronic device through communication networks such as the Internet, Intranet, Local Area Network (LAN), Wide LAN (WLAN), and Storage Area Network (SAN) or a combination thereof. Such a storage device may access the electronic device via an external port. Further, a separate storage device on the communication network may access a portable electronic device.

In the above-described detailed embodiments of the disclosure, an element included in the disclosure is expressed in the singular or the plural according to presented detailed embodiments. However, the singular form or plural form is selected appropriately to the presented situation for the convenience of description, and the disclosure is not limited by elements expressed in the singular or the plural. Therefore, either an element expressed in the plural may also include a single element or an element expressed in the singular may also include multiple elements.

Although specific embodiments have been described in the detailed description of the disclosure, various modifications and changes may be made thereto without departing from the scope of the disclosure. Therefore, the scope of the disclosure should not be defined as being limited to the embodiments, but should be defined by the appended claims and equivalents thereof.

The invention claimed is:

1. A method performed by a transmission device in a wireless communication system, the method comprising:
   transmitting a plurality of data code blocks (CBs) as an initial transmission;
   receiving feedback information including information for indicating a number of data CBs of which decoding fails among the plurality of data CBs, from each of at least one reception device;
   obtaining one or more parity CBs by applying an outer code to the data CBs based on the feedback information; and
   transmitting control information and the one or more parity CBs, to the at least one reception device as a retransmission,
   wherein the control information indicates a number of the one or more parity CBs transmitted by the retransmission and a length of a bit field of the control information is determined based on a maximum number of parity CBs capable of being transmitted at one time.

2. The method of claim 1, wherein the outer code includes at least one of a Reed-Solomon code, a BCH (Bose, Chaudhuri, Hocquenghem) code, a raptor code, and a parity bit generation code.

3. The method of claim 1, wherein the plurality of data CBs are transmitted via a multicast scheme,
wherein the at least one reception device comprises a plurality of reception devices, and
wherein the number of the one or more parity CBs is a maximum value among the numbers of data CBs that the plurality of reception devices fail to decode, respectively.

4. The method of claim 1,
wherein a value of a bit field in the control information indicates the number of the one or more parity CBs transmitted by the retransmission, and
wherein a predetermined value of the bit field, which is different from the value of the bit field in the control information, is used to indicate a transmission of data CBs as an initial transmission without transmission of parity CBs.

5. The method of claim 1, further comprising:
transmitting other data CBs at the retransmission; and
transmitting control information indicating at least one of a location and an amount of resources to which the other data CBs are allocated or a location and an amount of resources to which the parity CBs are allocated.

6. A method performed by a reception device in a wireless communication system, the method comprising:
receiving, from a transmission device, a plurality of data code blocks (CBs) as an initial transmission;
transmitting, to the transmission device, feedback information including information indicating a number of data CBs of which decoding fails among the plurality of data CBs; and
receiving from the transmitting device, control information and one or more parity CBs as a retransmission,
wherein the one or more parity CBs are associated with an outer code applied to the data CBs and the feedback information, and
wherein the control information indicates a number of the one or more parity CBs transmitted by the retransmission, and a length of a bit field of the control information is determined based on a maximum number of parity CBs capable of being transmitted at one time.

7. The method of claim 6, wherein the outer code includes at least one of a Reed-Solomon code, a BCH (Bose, Chaudhuri, Hocquenghem) code, a raptor code, or a parity bit generation code.

8. The method of claim 6, further comprising:
receiving other data CBs from the transmission device as an initial transmission,
wherein the feedback information includes information indicating a maximum value between a number of data CBs of which decoding fails among the plurality of data CBs, and the number of data CBs of which decoding fails among the other data CBs.

9. The method of claim 6,
wherein a value of a bit field in the control information indicates the number of the one or more parity CBs transmitted by the retransmission, and
wherein a predetermined value of the bit field, which is different from the value of the bit field in the control information, is used to indicate a transmission of data CBs as an initial transmission without transmission of parity CBs.

10. The method of claim 6, further comprising:
receiving other data CBs from the transmission device at the retransmission; and
receiving, from the transmission device, control information indicating at least one of a location and an amount of resources to which the other data CBs are allocated or a location and an amount of resources to which the parity CBs are allocated.

11. An apparatus in a wireless communication system, the apparatus comprising:
a transceiver; and
at least one processor operably coupled to the transceiver, and configured to:
transmit a plurality of data code blocks (CBs) as an initial transmission,
receive feedback information including information for indicating a number of data CBs of which decoding fails among the plurality of data CBs, from each of at least one reception device,
obtain one or more parity CBs by applying an outer code to the data CBs based on the feedback information; and
transmit control information and the one or more parity CBs to the at least one reception device as a retransmission,
wherein the control information indicates a number of the one or more parity CBs transmitted by the retransmission, and a length of a bit field of the control information is determined based on a maximum number of parity CBs capable of being transmitted at one time.

12. The apparatus of claim 11,
wherein the outer code includes at least one of a Reed-Solomon code, a BCH (Bose, Chaudhuri, Hocquenghem) code, a raptor code, and a parity bit generation code.

13. The apparatus of claim 11, wherein the plurality of data CBs are transmitted via a multicast scheme,
wherein the at least one reception device includes a plurality of reception devices, and
wherein the number of the one or more the parity CBs is a maximum value among the numbers of data CBs that the plurality of reception devices fail to decode, respectively.

14. The apparatus of claim 11,
wherein a value of a bit field in the control information indicates the number of the one or more parity CBs transmitted by the retransmission, and
wherein a predetermined value of the bit field, which is different from the value of the bit field in the control information, is used to indicate a transmission of data CBs as an initial transmission without transmission of parity CBs.

15. The apparatus of claim 11, wherein the at least one processor is further configured to:
transmit other data CBs at the retransmission, and
transmit control information indicating at least one of a location and an amount of resources to which the other data CBs are allocated or a location and an amount of resources to which the parity CBs are allocated.

* * * * *